(12) United States Patent
Jan et al.

(10) Patent No.: US 11,054,471 B2
(45) Date of Patent: Jul. 6, 2021

(54) ELECTRICAL TESTING APPARATUS FOR SPINTRONICS DEVICES

(71) Applicant: Taiwan Semiconductor Manufacturing Company, Ltd., Hsinchu (TW)

(72) Inventors: Guenole Jan, San Jose, CA (US);
Huanlong Liu, Sunnyvale, CA (US);
Jian Zhu, San Jose, CA (US);
Yuan-Jen Lee, Fremont, CA (US);
Po-Kang Wang, Los Altos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 15 days.

(21) Appl. No.: 16/714,881

(22) Filed: Dec. 16, 2019

(65) Prior Publication Data
US 2020/0116790 A1    Apr. 16, 2020

Related U.S. Application Data

(62) Division of application No. 15/902,407, filed on Feb. 22, 2018, now Pat. No. 10,509,074.

(51) Int. Cl.
*G01R 31/319* (2006.01)
*G11C 29/14* (2006.01)
(Continued)

(52) U.S. Cl.
CPC ... *G01R 31/31908* (2013.01); *G01R 31/2841* (2013.01); *G01R 31/3167* (2013.01);
(Continued)

(58) Field of Classification Search
CPC ........ G01R 31/31908; G01R 31/31905; G01R 31/3167; G11C 29/14; G11C 29/38; G11C 29/12
See application file for complete search history.

(56) References Cited

U.S. PATENT DOCUMENTS 5,375,075 A    12/1994 Ogata et al.
6,067,262 A    5/2000 Irrinki et al.
(Continued)

FOREIGN PATENT DOCUMENTS

TW    200409930 A    6/2004

OTHER PUBLICATIONS

European Search Report dated Jul. 12, 2019, Application No. 19158801.1, 7 pages.
(Continued)

*Primary Examiner* — Joseph D Torres
(74) *Attorney, Agent, or Firm* — Haynes and Boone, LLP

(57) ABSTRACT

A method includes receiving tester configuration data, test pattern data, and tester operation data; configuring a circuit for performing a designated test evaluation; generating a stimulus waveform; converting the stimulus waveform to an analog stimulus signal; transferring the analog stimulus signal to a first terminal of a MTJ DUT at reception of a trigger timing signal; generating time traces based on the trigger timing signal; generating a response signal at a second terminal of the MTJ DUT and across a termination resistor as the analog stimulus signal is transferred through the MTJ DUT; converting the response signal to a digitized response signal indicating its voltage amplitude; and performing the designated test evaluation and analysis function in the configurable circuit based on voltage amplitudes and time values of the stimulus waveform, the digitized response signal, and the timing traces.

20 Claims, 15 Drawing Sheets

(51) Int. Cl.

| | |
|---|---|
| *G11C 29/38* | (2006.01) |
| *G11C 29/12* | (2006.01) |
| *G01R 31/3167* | (2006.01) |
| *G01R 31/28* | (2006.01) |
| *G01R 31/3185* | (2006.01) |
| *G06F 11/263* | (2006.01) |
| *G11C 11/16* | (2006.01) |
| *H03M 1/12* | (2006.01) |

(52) U.S. Cl.
CPC ... *G01R 31/3185* (2013.01); *G01R 31/31905* (2013.01); *G01R 31/31917* (2013.01); *G01R 31/31924* (2013.01); *G06F 11/2635* (2013.01); *G11C 11/161* (2013.01); *G11C 29/12* (2013.01); *G11C 29/14* (2013.01); *G11C 29/38* (2013.01); *H03M 1/12* (2013.01)

(56) References Cited

U.S. PATENT DOCUMENTS

| | | | |
|---|---|---|---|
| 6,536,006 | B1 | 3/2003 | Sugamori |
| 6,681,359 | B1 | 1/2004 | Au et al. |
| 6,874,111 | B1 | 3/2005 | Adams et al. |
| 6,927,569 | B2 | 8/2005 | Worledge et al. |
| 7,158,407 | B2 | 1/2007 | Rizzo et al. |
| 7,327,153 | B2 | 2/2008 | Weinraub |
| 7,376,872 | B1 | 5/2008 | Nelson et al. |
| 7,929,334 | B2 | 4/2011 | Rao et al. |
| 9,252,187 | B2 | 2/2016 | Wang et al. |
| 10,151,791 | B1 * | 12/2018 | Spinner ............... G01R 31/3167 |
| 2002/0021140 | A1 | 2/2002 | Whetsel |
| 2003/0229886 | A1 | 12/2003 | Hasegawa et al. |
| 2004/0103356 | A1 | 5/2004 | Boehler |
| 2004/0230870 | A1 | 11/2004 | Wang et al. |
| 2006/0216837 | A1 | 9/2006 | Hachisuke et al. |
| 2007/0300117 | A1 | 12/2007 | Krech |
| 2008/0126903 | A1 | 5/2008 | Wegener |
| 2014/0139209 | A1 | 5/2014 | Lee et al. |
| 2016/0086678 | A1 | 3/2016 | Botea et al. |
| 2016/0245864 | A1 | 8/2016 | Mydill |
| 2017/0269147 | A1 * | 9/2017 | Rezgui ............... G01R 31/2834 |
| 2019/0178937 | A1 * | 6/2019 | Zhan .................. G01R 31/316 |
| 2019/0257881 | A1 | 8/2019 | Jan et al. |

OTHER PUBLICATIONS

Fei Li et al., "An Optimized Resistance Characterization Technique for the Next Generation Magnetic Random Access Memory," IEEE Transactions on Nanotechnology, vol. 14, No. 3, May 2015, pp. 540-545.

* cited by examiner

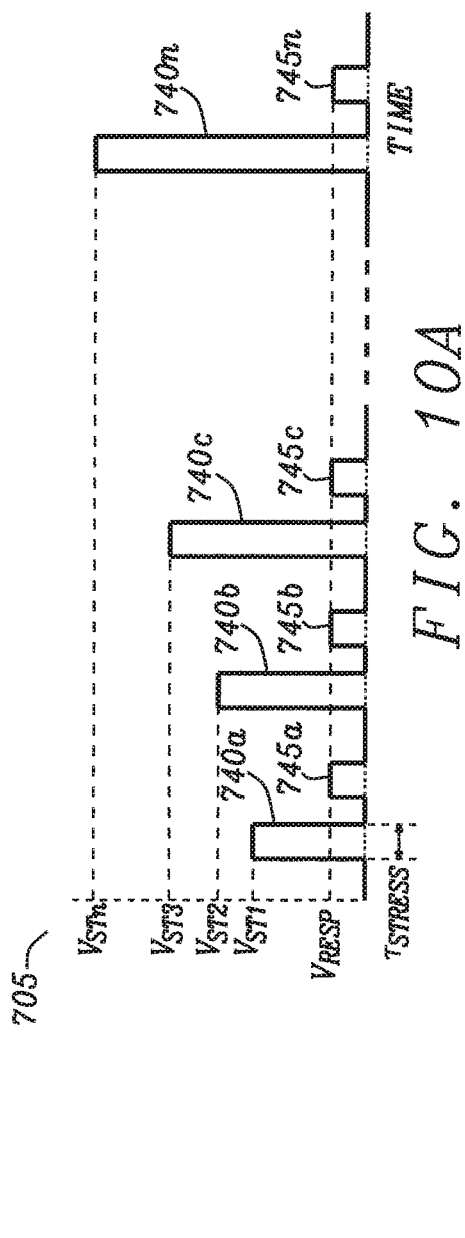
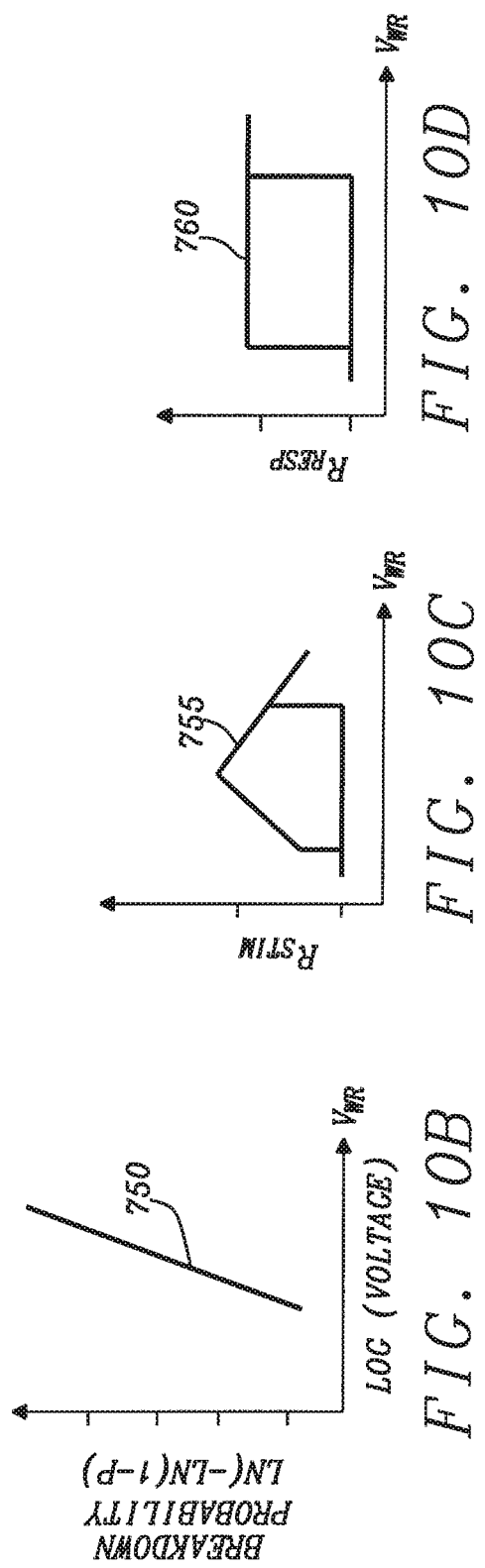

ELECTRICAL TESTING APPARATUS FOR SPINTRONICS DEVICES

PRIORITY DATA

The present application is a divisional application and claims the benefit of U.S. patent application Ser. No. 15/902,407, entitled "Electrical Testing Apparatus for Spintronics Devices," filed Feb. 22, 2018, herein incorporated by reference in its entirety.

TECHNICAL FIELD

This invention relates to the field of magnetic device testing. More particularly, this disclosure relates to systems and methods for testing magnetic devices that require high speed electrical testing and deep error rate testing.

BACKGROUND

FIG. 1A is a diagram of a magnetic tunnel device (MTJ) 5 of the prior art. The magnetic tunnel junction 5 is a stack that has a tunnel barrier insulating layer 7 sandwiched between a storage or free magnetic layer 6 and a reference or pinned magnetic layer 8. The storage or free magnetic layer 6 can orient its magnetization 10 and 11 in the desired direction. The reference or pinned magnetic layer 18 has a magnetization 12 direction that is fixed.

In the MTJ 5, the evanescent transmission of the electrons through the tunnel barrier insulating layer 7 determines the resistance of the MTJ 5. In the pinned the free magnetic layer 16 and the magnetic layer 8, the electric current consists of two partial currents, each with either spin-up 10 or spin-down electrons 11. In the tunneling process in which electron spin is conserved, the tunneling conductance depends on whether the magnetizations 10, 11, and 12 of the pinned magnetic layer 8 and the free magnetic layer 6 are parallel 10 and 12 or antiparallel 11 and 12.

FIG. 1B is a diagram of a magnetic electrical test apparatus for determining the electrical properties of a magnetic tunnel junction device of the prior art. The magnetic electrical test apparatus includes a device under test (DUT) holder 15. The DUT holder 15 has a first DUT contact 16 and a second DUT contact 17 between which the MTJ DUT 5 is placed for testing. A ground reference contact 18 is placed on the holder 10 to provide the ground reference for the attached test head electronics 20. The test head electronics 20 has an arbitrary word generator 25 that has an output connected to a first terminal of a first termination resistor 30.

A reference terminal of the arbitrary word generator 25 is connected to a second terminal of the first termination resistor 30. The second terminal of the first termination resistor is connected to the ground reference contact 18 of the DUT holder 15. The ground reference contact 18 is connected to a second terminal of the second termination resistor 35 and thus to a reference terminal of the digitizer 40.

An input terminal of the arbitrary word generator 25 is connected to a computer system 45 that generates a digital word 50. The digital word 50 is applied to the arbitrary word generator 50 to initiate the generation of the stimulus signal that is transferred from the arbitrary word generator 50 to the first terminal of the first termination resistor 30. The first terminal of the first termination resistor 30 is connected to the first DUT contact 16 and thus to one of the magnetic layers 6 or 8 of the MTJ DUT 5.

The stimulus signal is transferred through the MTJ DUT 5 to a second DUT contact 17 and thus to a first contact of a second termination resistor 35 as the MTJ DUT 5 response signal that is the voltage level developed across the second termination resistor 35. The first contact of the second termination resistor is connected to an input terminal of a digitizer circuit 40 that records and digitizes the response signal as a digital word 55. The digital word 55 is transferred to the computer 45 for further processing. The value of second termination resistor 35 is known and the measured magnitude of the voltage developed across the second termination resistor 35 is proportional to the current flowing through the MTJ DUT 5. When the magnitude of the output voltage of the arbitrary word generator 50 as applied to the first terminal of the first termination resistor 30 is measured, the resistance of the MTJ DUT 5 can be inferred.

FIGS. 2A and 2B are plots of a stimulus waveform applied to and a response waveform from the MTJ DUT 5 of FIG. 1A in the magnetic electrical test apparatus of FIG. 1B. One electrical test for the MTJ DUT 5 consists of applying a voltage pulse to the first terminal of the first termination resistor 30 and recording the voltage present at the first terminal of the second termination resistor 35 for determining the resistance state after the pulse to assess the effect of the pulse.

In FIG. 2A, a stimulus waveform is generated in the arbitrary word generator 25 and applied to the first terminal of the first termination resistor 30 and thus to one of the magnetic layers 6 or 8 of the MTJ DUT 5. The signal consists of a stimulus write pulse 60 of high voltage amplitude from approximately 50 mv to approximately 2000 mv for a duration of from approximately 0.5 ns to approximately 2000 ns. The stimulus write pulse 60 is followed by a first stimulus read pulse 65 and a stimulus read pulse 70. The first stimulus read pulse 65 is a negative polarity having an amplitude of from approximately 10 mv to approximately 200 mv for a duration of from approximately 0.5 ns to approximately 100 ns. The second stimulus read pulse 70 is a positive polarity having an amplitude of from approximately 10 mv to approximately 200 mv for a duration of from approximately 0.5 ns to approximately 100 ns.

In FIG. 2B, a response waveform is received from the one of the magnetic layers 6 or 8 of the MTJ DUT 5 and applied to the contact 17 and thus the first terminal of the second termination resistor 35. The signal consists of the response write pulse 75 of a higher voltage amplitude from approximately 0.125 mv to approximately 5 mv for a duration of from approximately 0.5 ns to approximately 2000 ns. The response write pulse 75 is followed by a first response read pulse 80 and a second response read pulse 85. The first response read pulse 80 is a negative polarity having an amplitude of from approximately 0.025 mv to approximately 0.5 mv for a duration of from approximately 0.5 ns to approximately 100 ns. The second response read pulse 85 is a positive polarity having an amplitude of from approximately 0.025 mv to approximately 0.5 mv for a duration of from approximately 0.5 ns to approximately 100 ns. It will be noted that the amplitude of the response signal of FIG. 2B is much lower than the stimulus signal of FIG. 2A as the voltage drop across the second termination resistor 35 that is usually a 50 ohm resistor is much lower than across the MTJ DUT 5 that has a resistance of approximately 20 KΩ.

The resistance state of the MTJ DUT 5 is evaluated by converting the response voltage measurement acquired and digitized by the digitizer circuit 40 and transmitted as the digital word 55 to the computer 45. The computer 45 calculates the resistance of the MTJ DUT 5 since the resistance of the second termination resistor 35 and the applied voltage of the stimulus read pulses 65 and 70 is known. The advantages of having two response pulses 65 and 70 of opposing amplitudes is the ease of removal of any voltage offset present in the testing apparatus (from contacts or amplifier offsets). The offset is removed by calculating the average current during both stimulus read pulses 65 and 70. In current testing apparatus, the computer system 45 that generates the stimulus digital word 50 that is applied to the arbitrary word generator 50 through a universal serial bus (USB) or a General Purpose Interface Bus (GPIB). The digitizer circuit 40 transfers the response digital word 55 to the computer 40 through a PCI eXtensions for Instrumentation (PXI) interface.

One drawback of the magnetic electrical test apparatus of the prior art as shown in FIG. 1B has relatively slow execution time because of the communication handshaking between the computer and digitizer. While a typical stimulation waveform as shown in FIG. 2A may be less than 100 ns, it would take a few milliseconds to get the data to the computer for processing and the computer 40 would take additional 100's of microseconds to process the data. The test patterns executed by the magnetic electrical test apparatus of the prior art may include series of stimulus waveforms generated by the arbitrary waveform generator 25 that include as many as a few thousand waveform patterns. These waveforms patterns must be acquired by the digitizer circuit 40 and digitized into the response digital waveform 55. The digitizer circuit 40 must format the digitized data to conform with the protocol of the PXI interface (or other equivalent interface). While executing test patterns with a larger number of waveforms will minimize the handshaking delay between the digitizer circuit 40, the processing of the digitized waveforms will increase the measurement time overhead and increase the amount of computer memory to store the data of the series of waveforms. For instance, a series of 1,000 waveforms having a pulse width of 100 ns as acquired at a sampling rate of 1 Ghz requires 100,000 data points. If there is a decision making process based on the data recorded during the acquisition by the digitizer circuit 40, an additional overhead of approximately 10,000 times the actual stimulation waveform pulse width may be required.

SUMMARY

An object of this disclosure is to provide a stimulus and response controller for a magnetic electrical test apparatus for testing, evaluating and a magnetic tunnel junction device.

Another object of this invention is to minimize processing and communication overhead to allow for rapid analysis of response signals and result determination during electrical evaluation and characterization of a magnetic tunnel junction device under test (MTJ DUT).

To accomplish at least one of these objects, a stimulus/response controller is configured for generating stimulus signals to be applied to at least one MTJ DUT and capturing and retaining response signals from the at least one MTJ DUT. The stimulus/response controller has a communication interface connected to a tester controller for receiving tester configuration instructions, tester operating instructions, and test stimulus instructions from the tester controller and transmitting response results to the tester controller.

The stimulus/response controller includes a configurable function circuit that is selectively configured for performing analytical and evaluation operations of the response data prior to transmission to the tester controller.

The stimulus/response controller has a test function configurator that is in communication through the tester interface with the tester controller for receiving the test configuration instructions. The test function configurator is configured for decoding the test configuration instructions and transferring the decoded test configuration to the configurable function circuit for constituting the configurable function circuit to a function detailed in the test configuration instructions.

The stimulus/response controller has a stimulus memory that is connected to the communication interface for receiving and configured for retaining test commands and instruction data. A stimulus waveform generator is connected to the stimulus memory for extracting the test commands and instruction data from the stimulus memory. The stimulus waveform generator is configured for decoding the test commands and instruction data to form stimulus signal data. The stimulus waveform generator is in communication with the at least one MTJ DUT through a digital-to-analog converter (DAC) for applying the stimulus signal to the at least one MTJ DUT.

A timing trigger is initiated by the tester controller that is received by the communication interface and conveyed to the stimulus waveform generator for transmission by the stimulus waveform generator of the stimulus signal data to the DAC. The DAC transmits an analog stimulus signal to a first terminal of a first termination resistor and thus to one of the magnetic layers of the at least one MTJ DUT. The analog stimulus signal passes through the MTJ DUT an analog response signal to a first terminal of a second termination resistor and to an input terminal of an analog-to-digital converter (ADC). The output of the ADC is a digitized response signal indicating the amplitude of the analog stimulus signal at the input terminal of the ADC. The digitized response signal is applied to a response waveform receiver that captures the digitized response signal upon receipt the timing trigger. The response waveform receiver places the captured digitized response signal in a response memory location.

The stimulus signal data and the time trace of the timing trigger is transferred to a time trace recorder that captures the stimulus signal data and the trigger time trace. The captured stimulus signal data and the trigger time trace are transferred to the response memory for pairing with the captured response waveform for the further processing.

In some embodiments, the configurable function circuit is constituted as a response pulse averaging circuit. The response pulse averaging circuit retrieves the stimulus signal data and the captured digitized response waveform for each of the trigger time traces from the response memory. The stimulus signal data is structured such that the stimulus waveform is constructed of a single write pulse followed by multiple read pulses. The captured digitized response signal is the amplitude of the response of the at least one MTJ DUT to the analog stimulus signal. The response pulse averaging circuit removes the write signal from the captured digitized response waveform and averages all of the responses of the stimulus read signals and all of the captured digitized read waveforms for determining an average response amplitude of all the digitized response read waveforms. The average response amplitude data is stored to the response memory.

In some embodiments, the configurable function circuit is constituted as a differential resistance calculator that is configured for determining a differential resistance of a magnetic tunnel junction. The stimulus signal data is structured such that the stimulus waveform is constructed of a first pulse of a first amplitude followed by a second pulse of a second amplitude. The captured digitized response signal is the amplitude of the response of the at least one MTJ DUT to the analog stimulus signal. The stimulus signal data and the captured digitized response data for a trigger time trace is retrieved from the response memory. A difference between an amplitude of a first response pulse and a second response pulse of the stimulus signal data is calculated. A difference between an amplitude of the first response pulse and a second response pulse of the captured digitized response data is calculated. A ratio of the response pulse difference at the first terminal and the response pulse difference at the second terminal of the one MTJ DUT is calculated. The differential resistance calculator then multiplies the response pulse difference ratio by a factor of 2 multiplied by the resistance value of the termination resistors to determine the differential resistance. The differential resistance for the measurements at a particular time trace are transferred to the response memory for storing.

In some embodiments, when the configurable function circuit is constituted as a time dependent dielectric breakdown tester with a constant voltage stress. A series of the resistance measurements from the response memory and determines a time at which the resistance of the one MTJ DUT begins to degrade. The degradation time is determined when the stimulus pulse voltage is a constant.

In some embodiments, the configurable function circuit is constituted as a time dependent dielectric breakdown tester with a ramped voltage stress. A series of the resistance measurements are extracted from the response memory and a voltage at which the resistance of the at least one MTJ DUT begins to degrade. The time to degradation occurring is determined when the write stimulus pulse voltage is an increasing ramp.

In some embodiments, the designated test function is a pulsed current/voltage tester. A series of the resistance measurements are extracted from the response memory and a resistance of the at least on MTJ DUT is determined during each response write pulse and during the response read pulse. The resistances of the of the at least one MTJ DUT is recorded in the response memory for further processing.

In some embodiments, the configurable function circuit is constituted as a bit error rate calculator. Multiple MTJ DUT's are tested with a number of write stimulus pulses that have a constant evaluation and analysis operations stimulus pulse voltage. The resistance is calculated and recorded for each pulsing and the number and time of the failures of the multiple MTJ DUT's is determined and recorded. The evaluation and analysis operations voltage is held at a constant for the number of pulses, but the multiple MTJ DUT's may be tested a number separate voltage levels each for the number of pulses. The failures for each of the voltage levels is determined and recorded. From the number of failures at the voltage levels and the times of the failures, a bit error rate is determined and recorded.

The response data that includes of the voltage of the response signal, the response pulse, average response pulse data, the differential resistance data, the degradation time with constant stress, the degradation time with ramped stress, and a failure count with times of failure is transferred, upon demand, to the communication interface for transfer to the tester controller for further processing.

In other embodiments that accomplish at least one of these objects, a magnetic electrical test apparatus is configured for receiving test patterns and instructions that are retained in a non-transitory medium having stored thereon a program of instructions executable by a tester controller. Where in the tester controller accesses and decodes the test patterns and instructions. The electrical test apparatus has a stimulus/response controller in communication with the tester controller to receive the decoded test patterns and instructions and configured for generating stimulus signals to be applied to at least one MTJ DUT and capturing and retaining response signals from the at least one MTJ DUT. The stimulus/response controller is structured as described above.

In various embodiments, the stimulus/response controller is field programmable gate array in which the functions described above are implemented with a configurable logic blocks. In particular, the configurable function circuit is implemented with configurable logic blocks structured to perform the designated test, evaluation, and analysis function.

In various embodiments that accomplish at one of these objects, the magnetic electrical test apparatus is configured for testing multiple MTJ DUT's. The testing multiple MTJ DUT's are arranged on individual test fixtures. The stimulus/response controller has demultiplexer that receives the stimulus signal data from the stimulus waveform generator and an MTJ DUT select signal from the interface controller. The MTJ DUT select signal determines which of the multiple MTJ DUT's is to receive the stimulus signal data from the demultiplexer. The response waveform receiver is connected each of the DAC's of the individual test fixtures for capturing the digitized response data. The captured digitized response data is transferred to the response memory and processed as above.

In other embodiments that accomplish at least one of these objects, the magnetic electrical test apparatus is configured for testing an array MTJ DUT's. The MTJ DUT's are arranged in rows and columns on a substrate that is mounted on a test fixture. The test fixture has one DAC that is connected to one terminator for each column of the array of the MTJ DUT's. The first terminal of the one terminator associated with each column of MTJ DUT's is connected to a first terminal of each of the MTJ DUT's of the associated column.

A second terminal of each of the MTJ DUT's on each row of the array of MTJ DUT's is connected to an ADC associated with the row of the array. The output digitized response data from each of the ADC's is applied to the response waveform receiver and transfers the digitized response data to the response memory to be processed as above.

Further in various embodiments that accomplish at one of these objects, a method for evaluating electrical characteristics of an MTJ DUT. The method begins by receiving tester configuration instructions, test pattern data, and tester operation data from a tester controller. The tester configuration instructions, test pattern data and tester operation data are retained in a non-transitory medium such as a stimulus memory.

The tester configuration instructions are decoded into configurations encoding a configurable function circuit for performing a designated test function. The tester operation data is decoded. Based upon the tester configuration data, tester operation data, and the test pattern data are used to generate a stimulus waveform with a series of pulses with selected voltage amplitudes. The stimulus waveform is transmitted to a DAC that converts the stimulus waveform to an analog stimulus waveform. The analog stimulus waveform is transmitted to the MTJ DUT at the reception of a trigger timing signal. Based on the trigger timing, signal time traces are generated and stored to a response memory with the voltage amplitude of the stimulus waveform. The voltage of response signal through the MTJ DUT device and across a second termination resistor then recorded and converted to a digitized response signal indicating its voltage amplitude. The voltage amplitude of the digitized response signal is stored to the response memory. For the function of the configured tester execution, the values of the voltage amplitudes and time values of the stimulus and the digitized response pulses using timing traces are extracted from the response memory.

In some embodiments, the designated test function is a response pulse averaging circuit. The response pulse averaging circuit retrieves the stimulus signal data and the captured digitized response waveform for each of the trigger time traces from the response memory. The stimulus signal data is structured such that the stimulus waveform is constructed of a single evaluation and analysis operations pulse followed by multiple response pulses. The captured digitized response signal is the amplitude of the response of the at least one MTJ DUT to the analog stimulus signal. The response pulse averaging circuit removes the evaluation and analysis operations signal from the captured digitized response waveform and averages all of the responses of the stimulus response signals and all of the captured digitized response waveforms for determining an average response amplitude of all the digitized response waveforms. The average response amplitude data is stored to the response memory.

In some embodiments, the designated test function is a differential resistance calculator that is configured for determining a differential response resistance of a magnetic tunnel junction. The stimulus signal data is structured such that the stimulus waveform is constructed of a first response pulse of a first amplitude followed by a second response pulse of a second amplitude. The captured digitized response signal is the amplitude of the response of the at least one MTJ DUT to the analog stimulus signal. The stimulus signal data and the captured digitized response data for a trigger time trace is retrieved from the response memory. A difference between an amplitude of a first response pulse and a second response pulse of the stimulus signal data is calculated. A difference between an amplitude of the first response pulse and a second response pulse of the captured digitized response data is calculated. A ratio of the response pulse difference at the first terminal and the response pulse difference at the second terminal of the one MTJ DUT is calculated. The differential resistance calculator then multiplies the response pulse difference ratio by a factor of 2 multiplied by the resistance value of the termination resistors to determine the differential resistance. The differential resistance for the measurements at a particular time trace are transferred to the response memory for storing.

In some embodiments, when the designated test function is a time dependent dielectric breakdown tester with a constant voltage stress. A series of the resistance measurements from the response memory and determines a time at which the resistance of the one MTJ DUT begins to degrade. The degradation time is determined when the write stimulus pulse voltage is a constant.

In some embodiments, the designated test function is a time dependent dielectric breakdown tester with a ramped voltage stress. A series of the resistance measurements are extracted from the response memory and a voltage at which the resistance of the at least one MTJ DUT begins to degrade. The voltage at which degradation occurs is determined when the write stimulus pulse voltage is an increasing ramp.

In some embodiments, the designated test function is a pulsed current/voltage tester. A series of the resistance measurements are extracted from the response memory and a resistance of the at least on MTJ DUT is determined during each response write pulse and during the response read pulse. The resistances of the of the at least one MTJ DUT is recorded in the response memory for further processing.

In some embodiments, the designated test function is a bit error rate calculator. Multiple MTJ DUT's are tested with a number of write stimulus pulses that have a constant write stimulus pulse voltage. The resistance is recorded for each pulsing and the number and time of the failures of the multiple MTJ DUT's is determined and recorded. The write stimulus pulse voltage is held at a constant for the number of pulses, but the multiple MTJ DUT's may be tested a number separate voltage levels each for the number of pulses. The failures for each of the voltage levels is determined and recorded. From the number of failures at the voltage levels and the times of the failures, a bit error rate is determined and recorded.

The response data that includes the amplitude of voltage of the response signal, the response pulse, average response pulse data, the differential resistance data, the degradation time with constant stress, the degradation time with ramped stress, and a failure count with times of failure is transferred, upon demand, to the communication interface for transfer to the tester controller for further processing.

BRIEF DESCRIPTION OF THE DRAWINGS

FIG. 10A is a plot of an increasing ramp voltage of a stimulus signal generated by a configurable stimulus/response controller for determining the time dependent dielectric breakdown (TDDB) of magnetic tunnel junction devices embodying the principals of this disclosure.

FIG. 10B is a plot of the results of an increasing ramp voltage of a stimulus signal generated by a configurable stimulus/response controller of FIG. 10A for determining the time dependent dielectric breakdown (TDDB) of magnetic tunnel junction devices embodying the principals of this disclosure.

FIGS. 10C and 10D are plots of results of an increasing ramp voltage of a stimulus signal generated by a configurable stimulus/response controller of FIG. 10A for determining the dynamic resistance and resistance after evaluation and analysis operations pulse for extracting tunnel magnetoresistance (TMR) of magnetic tunnel junction devices embodying the principals of this disclosure.

DETAILED DESCRIPTION

A stimulus/response controller within a magnetic electrical test apparatus is configured for generating and transmitting stimulus waveforms to a high-speed Digital-to-Analog Converter (DAC) for application to a Magnetic Tunnel Junction Device Under Test (MTJ DUT). The response signal from the MTJ DUT is applied to a Analog-to-Digital Converter (ADC). The digitized response signal from the ADC is transferred to response memory for use by the stimulus/response controller. The stimulus/response controller has a configurable function circuit that is selectively configured for performing evaluation and analysis of the digitized stimulus and response signals. The configurable function circuit may be structured for performing any evaluation function for determining the performance characteristics of the MTJ DUT(s). Examples of the evaluation and analysis operations include averaging the amplitude of voltage of evaluation and analysis operations and/or response pulse signals for a number of evaluation and analysis operations or response pulses, determining the differential resistance of the MTJ DUT(s), the degradation time with constant stress of the MTJ DUT(s), the degradation time with ramped stress of the MTJ DUT(s), and a failure count with times of failure of the MTJ DUT(s) or the bit error rate of the MTJ DUT(s). Other functions for the characterization of the performance of the MTJ DUT(s) may be required and are in keeping with the principals of this disclosure. This minimizes the processing and communication overhead as well as allow for quick analysis and decision making during the electrical test. The averaged multiple digitized stimulus signals and digitized response signals and the differential resistance of the MTJ DUT is then available for transfer to a tester controller within the magnetic electrical test apparatus during or at the end of the test process using a standard communication protocol (LAN, USB, etc.).

Figure 3:
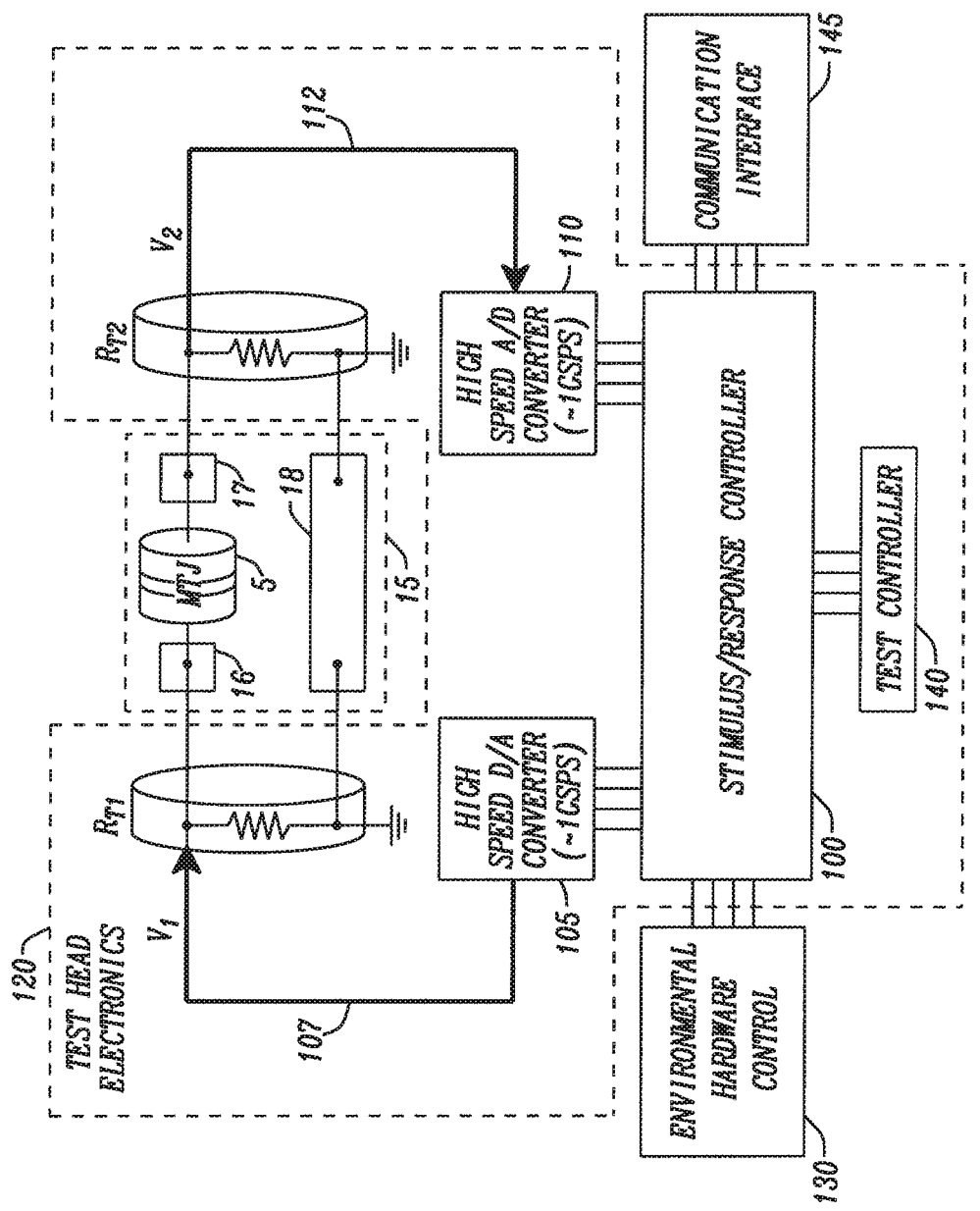
FIG. 3 is a diagram of a magnetic electrical test apparatus for determining the electrical properties of a magnetic tunnel junction device embodying the principals of the present disclosure.

FIG. 3 is a diagram of a magnetic electrical test apparatus for determining the electrical properties of a magnetic tunnel junction device 15 embodying the principals of the present disclosure. The magnetic electrical test apparatus has a test head electronics unit 120 that includes a stimulus/response controller 100. A tester controller 140 is in communication with the stimulus/response controller 100 and is configured for generating and providing test configuration data, tester operation data, and test patterns to stimulus/response controller 100.

An environmental controller 130 is in communication with the stimulus/response controller 100 for receiving environmental commands for control of environmental factors such a magnetic field, temperature, mechanical handling and probing and for transmitting environmental data from sensor in the environmental equipment. A communication interface 135 is in communication with the stimulus/response controller 100 for transmitting of tester configuration instructions for reconfiguring of the stimulus/response controller 100 from an external source or host (not shown). The tester configuration instructions define the structure of the stimulus/response controller 100 for performing the testing functions upon the MTJ DUT 5. The tester controller 140 is in communication with the communication interface 135 for receiving of the tester configuration data, the tester operation data, and the test pattern data from the external source or host.

The stimulus/response controller 100 decodes the test operation data and organizes the timing for the transmission of the test patterns to a high-speed DAC unit. The high-speed DAC unit converts the test patterns into the analog stimulus signal 107 that are applied to the first terminal of the first termination resistor 30 and then through the DUT holder 15 to the first terminal of the MTJ DUT 5. The test patterns pass through the MTJ DUT 5 to the second terminal of the MTJ DUT 5 and then to the first terminal of the second termination resistor 35 through the DUT holder 15. The first terminal of the second termination resistor 35 is connected to the input of the high-speed ADC 110. The high-speed ADC 110 converts the analog response signal 112 from the MTJ DUT 5 to a digitized response signal that is transferred to the stimulus/response controller 100.

Figure 4:
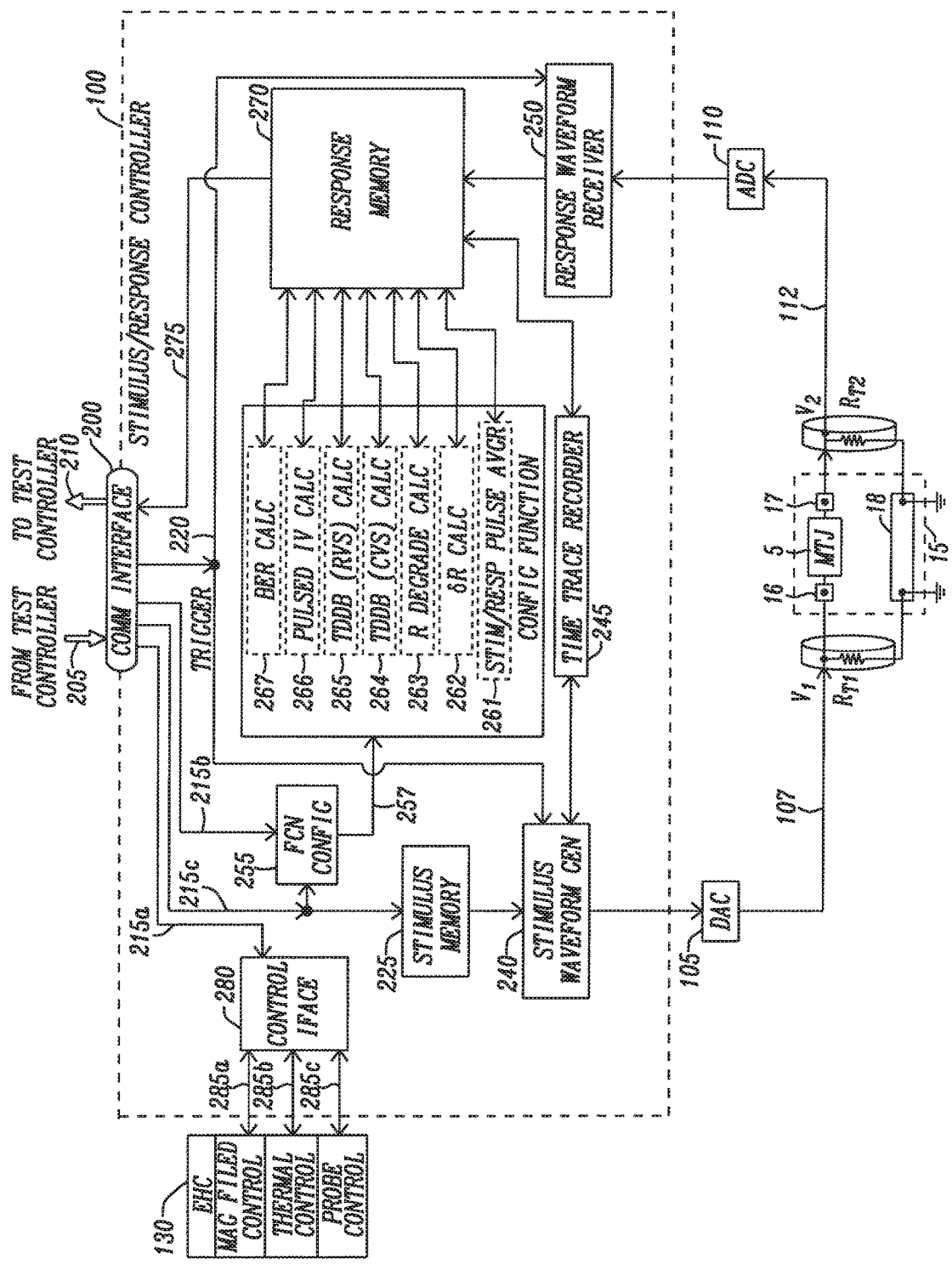
FIG. 4 is a functional block diagram of a configurable stimulus/response controller configured for generating the analog stimulus signal that is applied to the magnetic tunnel junction device, for receiving the response waveform from the magnetic tunnel junction device, and processing the digitized response signal for determining the characteristics of the magnetic tunnel junction device embodying the principals of this disclosure.

FIG. 4 is a functional block diagram of a configurable stimulus/response controller 100 configured for generating the analog stimulus signal 107 that is applied to the magnetic tunnel junction device 5, for receiving the response waveform 112 from the magnetic tunnel junction device 5, and processing the digitized response signal 112 to the characteristics of the magnetic tunnel junction device 5 embodying the principals of this disclosure. In various embodiments, the stimulus/response controller 100 is fabricated using a field programmable gate array (FPGA). The stimulus/response controller 100 is a field programmable gate array in which the functions described above are implemented with a configurable logic blocks. In particular, the configurable function circuit 255 is implemented with configurable logic blocks structured to perform the designated test function. The configurable stimulus/response controller 100 has a communication interface 200 in communication with the tester controller 140 of FIG. 3. An input connection 205 provides the test operation data, test pattern data, the environmental commands, and the tester configuration instructions.

The environmental commands 215a are transferred to the control interface 280 for encoding and conditioning for transfer to the environmental hardware controller 130. Representative of the hardware commands are the magnetic field controls 285a, the thermal controls 285b, and the probe controls 285c. The magnetic field controls 285a define the external magnetic fields that are applied to the MTJ DUT(s) 5 during the testing, the thermals controls 285b are the temperature adjustments during the testing for applying thermal stress to the MTJ DUT(s) 5, and the probe controls 285c that adjust the probe positioning for making electrical contact to the MTJ DUT(s) 5.

The tester configuration instructions 215b are transferred to the function configuration/control circuit 255. The function configuration/control circuit 255 is configured for decoding the tester configuration instructions 215b to generate the necessary configuring signals 257 for coding the hardware structure into the configurable function circuit 260. The configurable function circuit 260 may be structured for performing any evaluation function for determining the performance characteristics of the MTJ DUT(s) 5. Examples of the evaluation and analysis operations include averaging the amplitude of voltage of evaluation and analysis operations and/or response pulse signals for a number of evaluation and analysis operations or response pulses, determining the differential resistance of the MTJ DUT(s) 5, the degradation time with constant stress of the MTJ DUT(s) 5, the degradation time with ramped stress of the MTJ DUT(s) 5, and a failure count with times of failure of the MTJ DUT(s) 5 or the bit error rate of the MTJ DUT(s) 5. Other functions for the characterization of the performance of the MTJ DUT(s) 5 may be required and are in keeping with the principals of this disclosure.

The test operation data and the test pattern data 215c are transferred to and retained by the stimulus memory 225. The communication interface receives a trigger signal 220 from the tester controller 140 of FIG. 3 and transfers it to the stimulus waveform generator 240. The trigger signal 220 provides the timing for the transmission of the stimulus signals to the MTJ DUT(s) 5. When stimulus waveform generator 240 receives the trigger signal 220, the stimulus waveform generator 240 retrieves and decodes the test operation data and the test pattern data from the stimulus memory 225. The stimulus waveform generator is configured for forming a digital description of the stimulus signal that is to be applied to the MTJ DUT(s) 5. The digital description of the stimulus signal and a time trace of the trigger signal is transferred to and stored in the response memory 270.

The digital description of the stimulus signal is communicated to a digital-analog-converter (DAC) 105 for conversion to the analog stimulus signal 107. The analog stimulus signal 107 is applied to the first terminal of the first termination resistor $R_{T1}$ and the first terminal of the MTJ DUT 5. The MTJ DUT(s) 5 transfers the analog stimulus signal 107 through the MTJ DUT 5 to form an analog response signal 112 formed at the second terminal of the MTJ DUT 5 and the first terminal of the second termination resistor $R_{T2}$. The analog response signal 112 is applied to an analog-to-digital converter (ADC) 110. The ADC 110 transforms the analog response signal 112 to a digitized version of the analog response signal 112. The digitized response signal is transferred to the response waveform receiver 250. The response waveform receiver 250 is also connected to receive the trigger signal 220 from the communication interface. At the receipt of the trigger signal 220, the response waveform receiver 250 begins acquisition of the digitized response signal. The digitized response signal is transferred to the response memory 270 and stored to be synchronized with the time trace of the stimulus signal and the time trace of the trigger signal.

The test operation signals and the test pattern signals 215c are transferred to the function configuration/control circuit 255. The function configuration/control circuit 255 is configured for decoding the test operations for determining what evaluation and analysis operations are to be performed by the configurable function circuit 260.

The evaluation and analysis operations configured within the configurable function circuit 260 include a stimulus/response pulse averaging circuit 261, a differential resistance calculator 262, a time dependent dielectric breakdown tester 263, a time dependent constant voltage dielectric breakdown evaluation circuit 264, a time dependent ramped voltage dielectric breakdown evaluation circuit 265, a pulsed current/voltage test 266, and a bit error rate calculator 267.

Figure 1A:
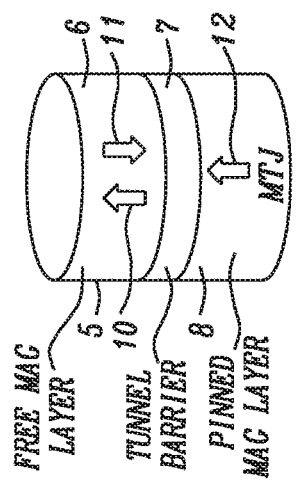
FIG. 1A is a diagram of a magnetic tunnel junction of the prior art.
Figure 1B:
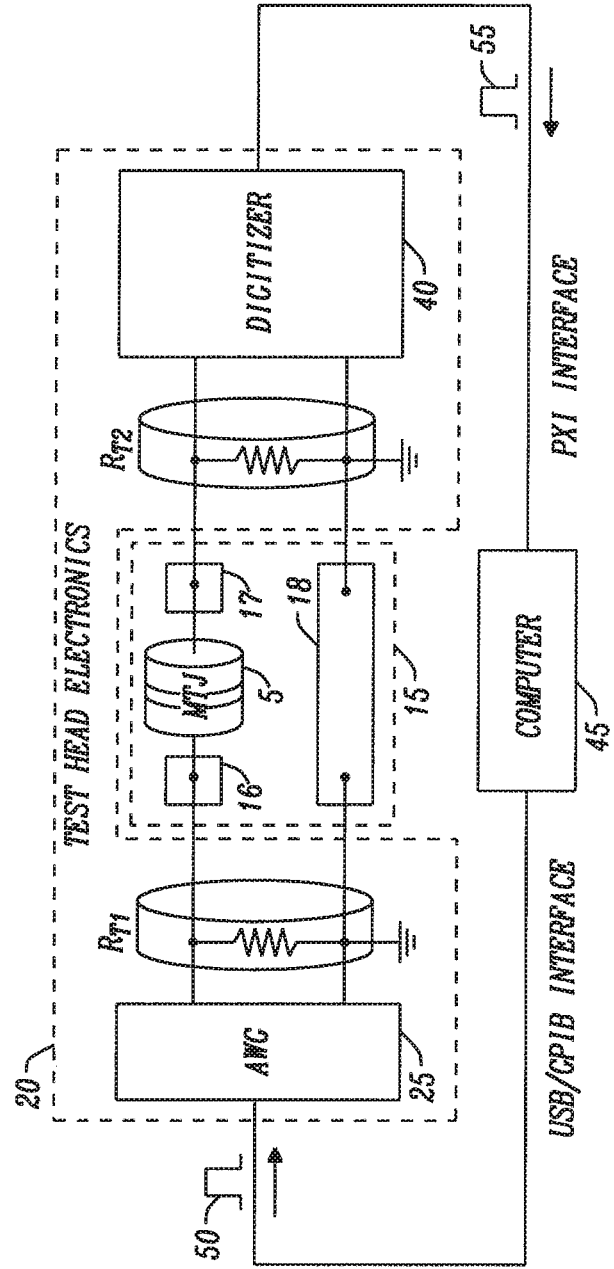
FIG. 1B is a diagram of a magnetic electrical test apparatus for determining the electrical properties of a magnetic tunnel junction device of the prior art.
Figure 2A:
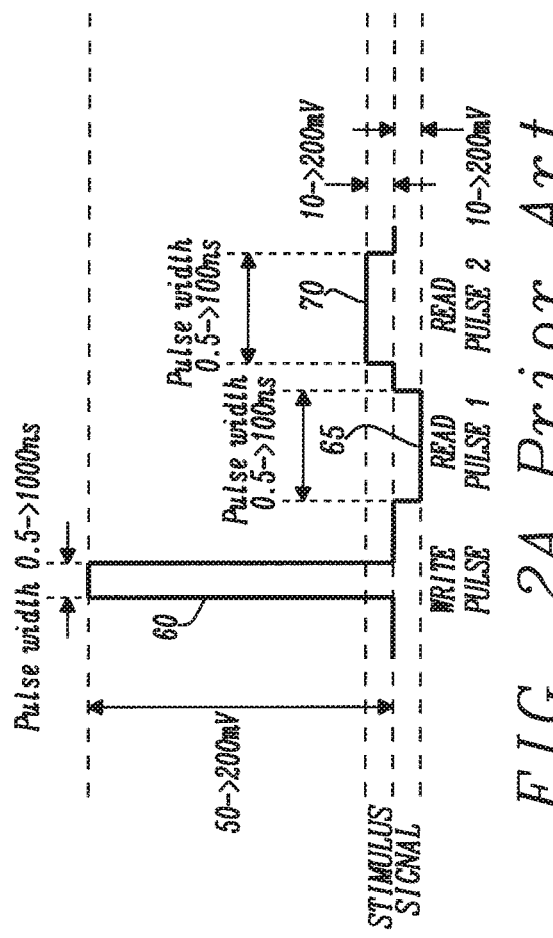
FIG. 2A is a plot of a stimulus waveform applied to the magnetic tunnel junction device of FIG. 1A in the magnetic electrical test apparatus of FIG. 1B.
Figure 2B:
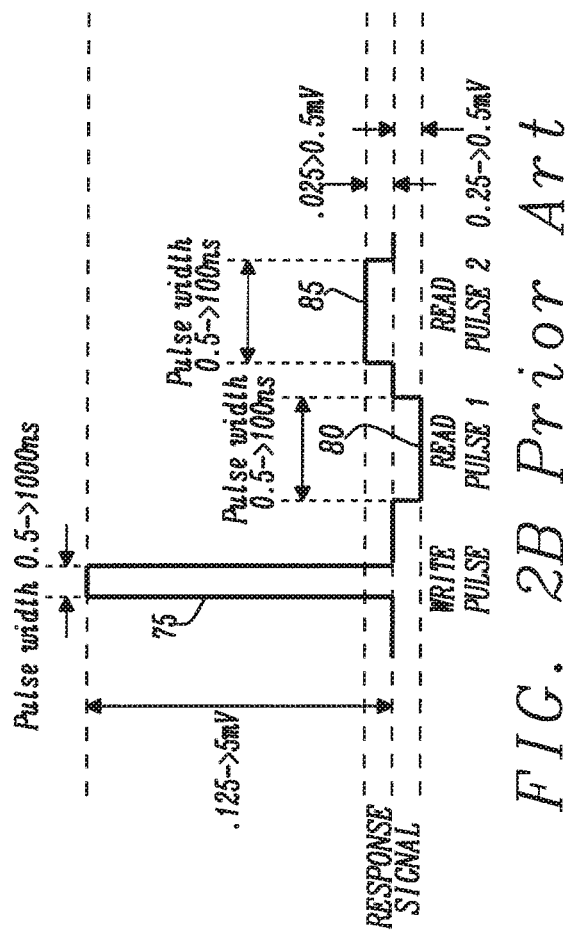
FIG. 2B is a plot of a response waveform received from the magnetic tunnel junction device of FIG. 1A in the magnetic electrical test apparatus of FIG. 1B.

The stimulus/response averaging circuit performs the function as described in FIGS. 2A and 2B. The digital description of the stimulus waveform of FIG. 2A is retrieved from the stimulus memory 225 and transferred to the stimulus waveform generator 240. The stimulus waveform generator 240 decodes the test and instruction commands to formulate the digital description of the stimulus waveform of FIG. 2A. The stimulus waveform generator 240 transfers the digital description of the stimulus waveform to the DAC 105 that generates the stimulus waveform 107 that includes the stimulus write pulse 60, the first read pulse 65, and the second read pulse 70. The stimulus waveform is applied to the first terminal of the first termination resistor 30 and thus to one of the magnetic layers 6 or 8 of the MTJ DUT 5. The voltage amplitudes are described above.

In FIG. 2B, the response waveform 112 is received from the one of the magnetic layers 6 or 8 of the MTJ DUT 5 and applied to the contact 17 and thus the first terminal of the second termination resistor 35. The response waveform 112 has structure as shown in of FIG. 2B and described above. The response waveform 112 is applied to the ADC 110 where the response waveform 112 is digitized. The ADC 110 transfers the digitized response signal to the response waveform receive 250 that stores the captured digitized response waveform in the response memory coordinated with the appropriate timing traces. The stimulus/response pulse averaging circuit 261 retrieves captured digitized response waveforms for a number of timing pulse and averages the amplitude of voltage of stimulus or response pulse signals for a number of response pulses. The evaluation and analysis operations/response pulse averaging circuit 261 stores the resulting averaging data to the response memory 270.

Figure 8A:
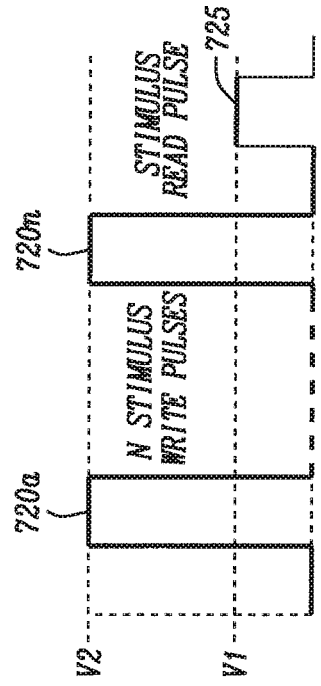
FIGS. 8A and 8B are plots of the stimulus signal and the response signal generated by a configurable stimulus/response controller for determining the differential resistance of magnetic tunnel junction devices embodying the principals of this disclosure.
Figure 8B:
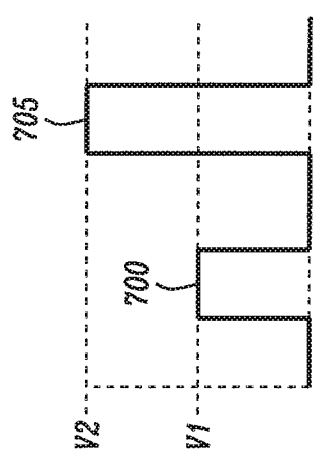

When the configurable function circuit 260 is configured as the differential resistance calculator 262, the differential resistance calculator 262 determines the differential resistance δR of the MTJ DUT(s) 5 by performing a differential resistance test. The differential calculation test requires that the stimulus signal data is structured such that the stimulus waveform 107 is constructed as shown in FIG. 8A of a first stimulus pulse 700 of a first amplitude followed by a second stimulus pulse 705 of a second amplitude. FIGS. 8A and 8B are plots of the stimulus waveform 107 as generated by a stimulus waveform generator 240 and the response waveform 112 from the MTJ DUT 5. The digital description of the stimulus waveform of FIG. 8A is retrieved from the stimulus memory 225 and transferred to the stimulus waveform generator 240. The stimulus waveform generator 240 decodes the test and instruction commands to formulate the digital description of the stimulus waveform of FIG. 8A. The stimulus waveform generator 240 transfers the digital description of the stimulus waveform to the DAC 105 that generates the stimulus waveform 107 that includes the first stimulus read pulse 700, and the second read pulse 705. The stimulus waveform 107 is applied to the first terminal of the first termination resistor 30 and thus to one of the magnetic layers 6 or 8 of the MTJ DUT 5. The voltage amplitudes of the first stimulus read pulse 700 is the value V1 and the voltage amplitudes of the second read pulse 705 is the value V2.

In FIG. 8B, the response waveform 112 is received from the one of the magnetic layers 6 or 8 of the MTJ DUT 5 and applied to the contact 17 and thus the first terminal of the second termination resistor 35. The response waveform 112 has structure as shown in of FIG. 8B and is nearly identical to the stimulus waveform 107 except the amplitude is now the first response read pulse 710 is the value V1' and the voltage amplitudes of the second response pulse 715 is the value V2'. The response waveform 112 is applied to the ADC 110 where it is digitized. The ADC 110 transfers the digitized response signal to the response waveform receiver 250 that stores the captured digitized response waveform in the response memory coordinated with the appropriate timing traces. The differential resistance calculator 262 retrieves captured digitized response waveforms for a number of timing traces and differential resistance for the MTJ (DUT). The differential resistance calculator 262 stores the resulting averaged data.

The differential resistance calculator 262 retrieves the digital stimulus signals and the captured digitized response data matching the response timing traces from the response memory 270. The differential resistance executes a calculation of the difference between an amplitude of a first response pulse and a second response pulse of the stimulus signal data. A difference between an amplitude of the first response pulse and a second response pulse of the captured digitized response data is calculated according to the equation:

$$\delta R \approx \frac{V_2 - V_1}{V_2' - V_1'} * 2 * R_{TERM}$$

Where:

$R_{MTJ} \gg R_{TERM}$

δR is the differential resistance of the MTJ DUT 5.

$V_1$ is the amplitude value of the first stimulus read pulse 700.

$V'_1$ is the amplitude value of the first response read pulse 710.

$V_2$ is the amplitude value of the second stimulus read pulse 705.

$V'_2$ is the amplitude value of the second response read pulse 715.

The differential resistance δR for the calculations from a particular time trace are transferred to the response memory 270 for storing.

Figure 9A:
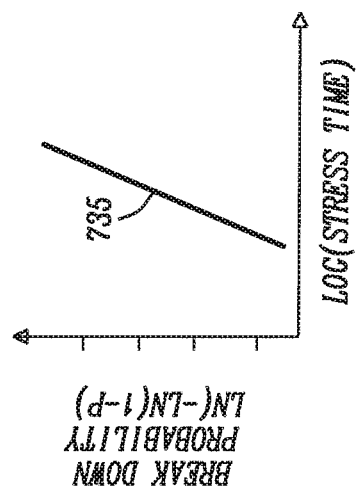
FIG. 9A is a plot of a constant voltage of a stimulus signal generated by a configurable stimulus/response controller for determining the time dependent dielectric breakdown (TDDB) of magnetic tunnel junction devices embodying the principals of this disclosure.

When the configurable function circuit 260 is constituted as a time dependent dielectric breakdown tester 264 with a constant voltage stress. The MTJ DUT 5 is subjected to series of stimulus write signals 720a, . . . , 720n having a constant amplitude followed by a stimulus read signal 725 as shown in FIG. 9A. The response signal 120 at the output of the MTJ DUT 5 is formed of the attenuated stimulus write signals 720a, . . . , 720n and the stimulus read signal 725. The response read signal (the attenuated stimulus read pulse 725) is transferred to the ADC 110 and is then digitized and transferred to the response waveform receiver 250. The response waveform receiver 250 then transfers the digitized response read signal to be stored in the response memory 270 with the timing trace records.

The time dependent dielectric breakdown tester 264 then extracts the digitized response read signals with the timing traces and determines the resistance of the MTJ DUT 5 at each of the timing traces. The resistances of the MTJ DUT 5 are then stored in the response memory 270 with the corresponding timing traces. At the completion of the application of the stimulus waveform, the resistances for the MTJ DUT 5 are extracted from the response memory 270. The time at which the resistance of the MTJ DUT 5 is determined and identified and flagged in the response memory 270.

When the configurable function circuit 260 is constituted as a time dependent dielectric breakdown tester 265 with a ramped voltage stress. The MTJ DUT 5 is subjected to a stimulus signal 107 that is formed of a series of stimulus write signals 740a, 740b, 740c, . . . , 740n with a ramping amplitude as shown in FIG. 10a. Each of the stimulus write signals 740a, 740b, 740c, . . . , 740n is followed by a stimulus read signal 745a, 745b, 740c, . . . , 725n. The response signal 120 at the output of the MTJ DUT 5 is formed of the attenuated stimulus write signals 740a, 740b, 740c, . . . , 740n and stimulus read signals 745a, 745b, 745c, . . . , 745n. The response write signals (the attenuated stimulus write signals 740a, 740b, 740c, . . . , 740n) and response read signals (the attenuated stimulus read signal 745a, 745b, 745c, . . . , 745n) are transferred to the ADC 110 and then digitized and transferred to the response waveform receiver 250. The response waveform receiver 250 then transfers the digitized response write signals and the digitized response read signals to the response memory 270 for storage the maximum amplitude of the stimulus write signals 740a, 740b, 740c, . . . , 740n, and the timing trace records in the response memory 270.

The time dependent dielectric breakdown tester 265 then extracts the digitized response write signals and digitized response read signals with the timing traces and determines the resistance of the MTJ DUT 5 at each of the digitized response write signals and the digitized response read signals. The resistances of the MTJ DUT 5 are then stored in the response memory 270 with the corresponding timing traces. At the completion of the application of the stimulus waveform, the resistances for the MTJ DUT 5 are extracted from the response memory 270. The maximum amplitude of the stimulus write signals 740a, 740b, 740c, . . . , 720n, and the timing trace records. The voltage of the stimulus write signals 740a, 740b, 740c, . . . , 720n at which the resistance of the MTJ DUT 5 begins to indicate breakdown of the tunnel barrier insulating layer 7 has occurred is determined and flagged in the response memory 270.

When the configurable function circuit 260 is constituted as a pulsed current/voltage calculator 266, the MTJ DUT 5 is subjected to a stimulus signal 107 that is formed of a series of stimulus write signals 740a, 740b, 740c, . . . , 740n with a ramping amplitude as shown in FIG. 10A. Each of the stimulus write signals 740a, 740b, 740c, . . . , 740n is followed by a stimulus read signal 745a, 745b, 740c, . . . , 725n. The response signal 120 at the output of the MTJ DUT 5 is formed of the attenuated stimulus write signals 740a, 740b, 740c, . . . , 740n and stimulus read signals 745a, 745b, 745c, . . . , 745n. The response write signals (the attenuated stimulus write signals 740a, 740b, 740c, . . . , 740n) and response read signals (the attenuated stimulus read signal 745a, 745b, 745c, . . . , 745n) are transferred to the ADC 110 and then digitized and transferred to the response waveform receiver 250. The response waveform receiver 250 then transfers the digitized response write signals and the digitized response read signals to the response memory 270 for storage the maximum amplitude of the stimulus write signals 740a, 740b, 740c, . . . , 740n, and the timing trace records.

Then a pulsed current/voltage calculator 266 extracts the amplitudes of the digitized response write signals and the digitized response read signals and determines the resistances of the MTJ DUT 5 at each of the write voltages of the stimulus write signals 740a, 740b, 740c, . . . , 740n and at each of the read voltages of the stimulus read signal 745a, 745b, 745c, . . . , 745n of FIG. 10A. The resistances of the MTJ DUT 5 and the corresponding voltage of the stimulus write signals 740a, 740b, 740c, . . . , 740n and the stimulus read signal 745a, 745b, 745c, . . . , 745n are stored in the response memory 270 with the timing trace records.

Figure 11A:
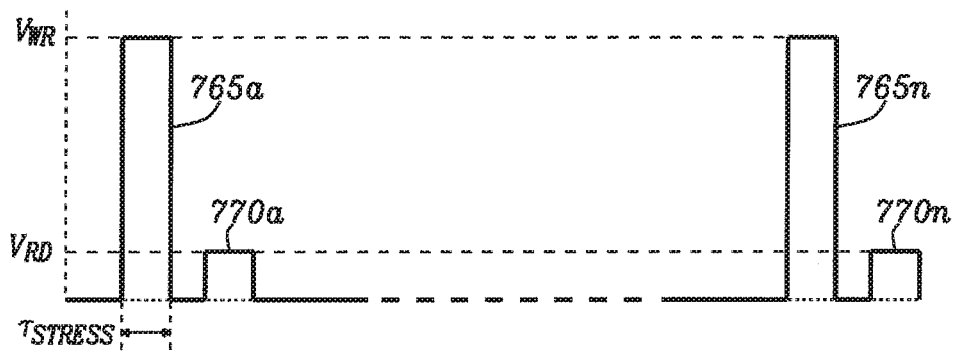
FIG. 11A is a plot of a evaluation and analysis operations/response waveform of a stimulus signal generated by a configurable stimulus/response controller for determining the bit error rates of magnetic tunnel junction devices embodying the principals of this disclosure.

When the configurable function circuit 260 is constituted as a bit error rate calculator 267, the MTJ DUT 5 is subjected to a stimulus signal 107 that is formed of a series of stimulus write signals 765a, 765b, 765c, . . . , 765n with a constant amplitude as shown in FIG. 11a. Each of the stimulus write signals 765a, 765b, 765c, . . . , 765n is followed by a stimulus read signal 770a, 770b, 770c, . . . , 770n. The response signal 120 at the output of the MTJ DUT 5 is formed of the attenuated stimulus write signals 765a, 765b, 765c, . . . , 765n and stimulus read signals 770a, 770b, 770c, . . . , 770n. The response write signals (the attenuated stimulus write signals 765a, 765b, 765c, . . . , 765n) and response read signals (the attenuated stimulus read signal 770a, 770b, 770c, . . . , 770n) are transferred to the ADC 110 and then digitized and transferred to the response waveform receiver 250. The response waveform receiver 250 then transfers the digitized response write signals and the digitized response read signals to the response memory 270 for storage with the timing trace records.

Then a bit error rate calculator 267 extracts the amplitudes of the digitized response write signals and the digitized response read signals and determines the resistances of the MTJ DUT 5 at each of the write voltages of the stimulus write signals The pulsed current/voltage calculator 266 extracts the amplitudes of the digitized response write signals and the digitized response read signals and determines the resistances of the MTJ DUT 5 at each of the write voltages of the stimulus write signals 765a, 765b, 765c, . . . , 765n and at each of the read voltages of the stimulus read signal 770a, 770b, 770c, . . . , 770n. The resistances of the MTJ DUT 5 and the corresponding voltage of the stimulus write signals 765a, 765b, 765c, . . . , 765n and the stimulus read signal 770a, 770b, 770c, . . . , 770n are stored in the response memory with the timing trace records. The bit error rate calculator 267 extracts the amplitudes of the and the digitized response read signals and determines the resistances of the MTJ DUT 5 at each of the of the read voltages of the stimulus read signal 770a, 770b, 770c, . . . , 770n. The resistances of the MTJ DUT 5 and the corresponding voltage of the stimulus write signals 765a, 765b, 765c, . . . , 765n and the stimulus read signal 770a, 770b, 770c, . . . , 770n are stored in the response memory 270 with the timing trace records.

The output 275 of the response memory 270 is connected to the communication interface 200 for transferring the response data to the communications interface 200 and then to the tester controller 140 of FIG. 3 for further evaluation and formatting for. The evaluation and analysis operations configured within the configurable functional circuit 260 as described above only illustrate some of the embodiments of the configurable functional circuit 260. Other embodiments will include configurable functions that will be used to evaluate the performance and characteristics of the at least one MTJ DUT 5.

Figure 5:
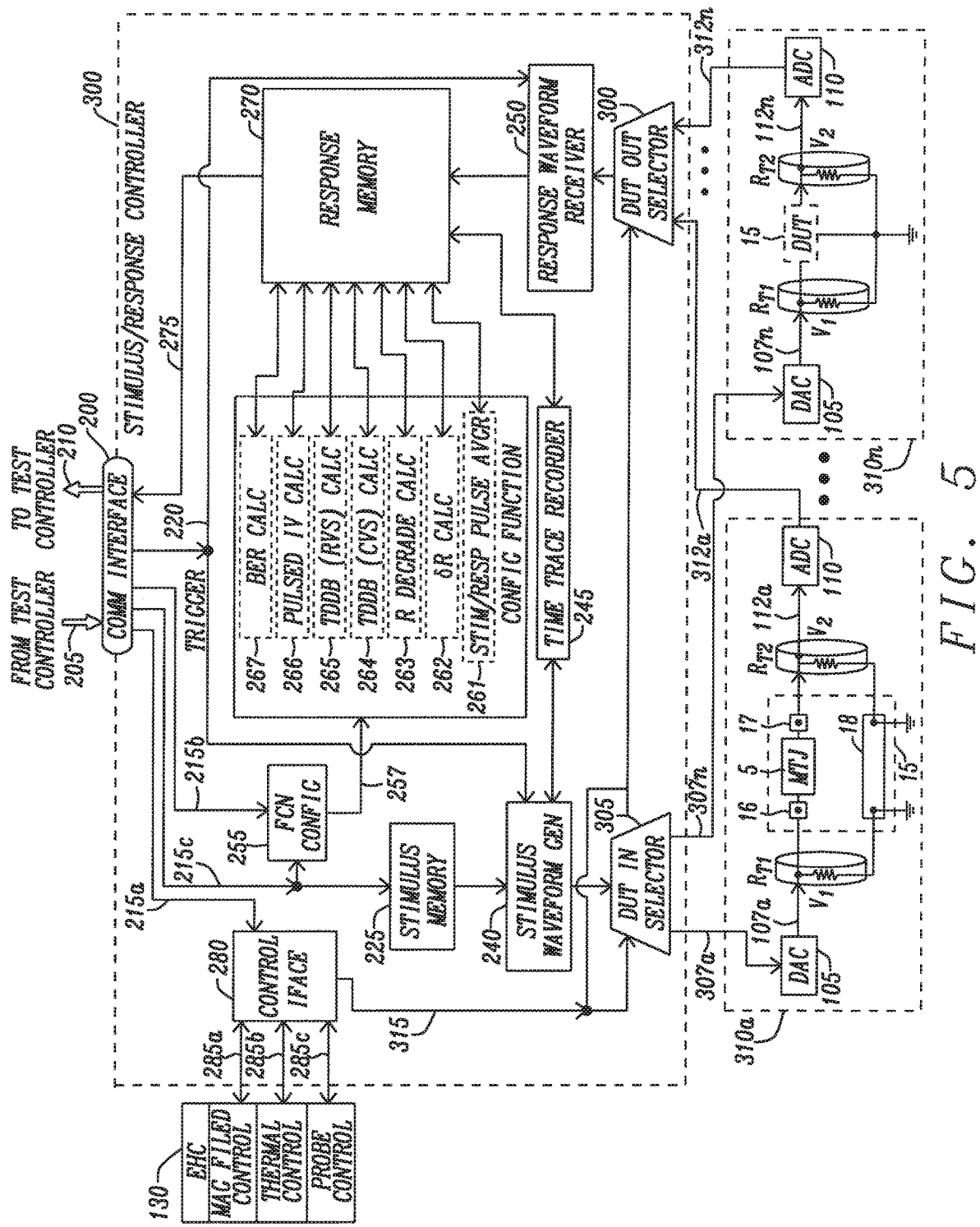
FIG. 5 is a functional block diagram of a configurable stimulus/response controller configured for generating the analog stimulus signal for evaluating multiple magnetic tunnel junction devices, for receiving the response waveform from the magnetic tunnel junction devices, and processing the digitized response signal for determining the characteristics of the multiple magnetic tunnel junction devices embodying the principals of this disclosure.

FIG. 5 is a functional block diagram of a configurable stimulus/response controller 300 configured for generating the analog stimulus signals 107a, . . . , 107n for evaluating multiple magnetic tunnel junction devices 5, for receiving the response waveforms 112a, . . . , 112n from the magnetic tunnel junction devices 5, and processing the digitized response signal for determining the characteristics of the multiple magnetic tunnel junction devices 5 embodying the principals of this disclosure. The fundamental structure and function of the configurable stimulus/response controller 300 is the same as the configurable stimulus/response controller 100 except for the addition of the MTJ DUT 5 test fixture input selector 305 and the MTJ DUT 5 test fixture output selector 320.

The MTJ DUT 5 test fixture input selector 305 is connected to the stimulus waveform generator 240 for receiving the digital description of the stimulus signal. The MTJ DUT 5 test fixture input selector 305 is also connected to the control interface 280. The environmental commands 215a are transferred to the control interface 280 for encoding and conditioning for transfer to the environmental hardware controller 130. In addition to the magnetic field controls 285a, the thermal controls 285b, and the probe controls 285c, the hardware commands include the test fixture selection controls 315. The test fixture selection controls 315 provide the control data for selecting the test fixtures 310a, . . . , 310n holding the MTJ DUT's 5 that are to be tested. The MTJ DUT 5 test fixture input selector 305 is connected to one DAC 105 on each of the test fixtures 310a, . . . , 310n hold one of the MTJ DUT's 5. As described above, the test operation and the test pattern signals 215c are transferred to and retained by the stimulus memory 225 and upon receipt of the trigger signal 220, the stimulus waveform generator retrieves the test operation and test pattern signals from the stimulus memory 225 decodes the test operation data and forms the test pattern signals into the digital description of the analog stimulus signal. The digital description of the analog stimulus signal is transferred to the DUT input selector circuit 305. The test fixture selection controls 315 select at least one of the outputs of the DUT input selector circuit 305 for transferring the digital descriptions of the analog stimulus signal on the outputs 307a, . . . , 307n to inputs of the DAC 105 on the at least one of the test fixtures 310a, . . . , 310n.

The digital descriptions of the analog stimulus signals converted to the analog signals 107a, . . . , 107n and applied to first terminal of the selected MTJ DUT's 5. As described above, the response analog signal 112a, . . . , 112n is present at the second terminal of the selected MTJ DUT's 5 for transfer to the input of the ADC 110 of each of the test fixtures 310a, . . . , 310n. The ADC 110 converts the response analog signal or signals 112a, . . . , 112n to digitized response analog signals 312a, . . . , 312n that are transferred to the DUT output selector circuit 320. The digitized response analog signals 312a, . . . , 312n of the are selected from the ADC's 111 of the selected the test fixtures 310a, . . . , 310n are transferred from the DUT output selector circuit 320 to the response waveform receiver 250. The digitized response analog signals 312a, . . . , 312n are then transferred to the response memory 270 for evaluation and characterization as described above.

Figure 6:
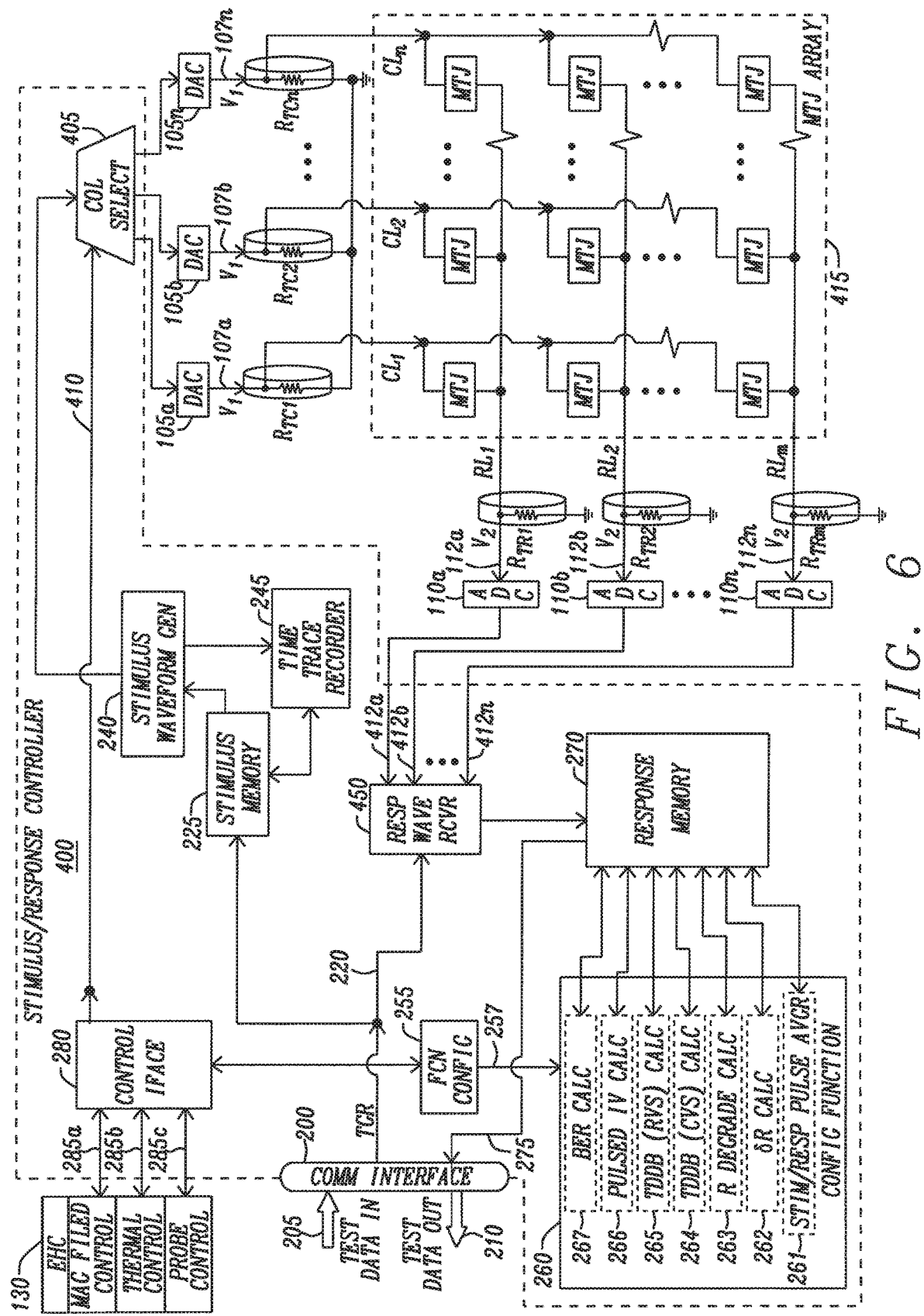
FIG. 6 is a functional block diagram of a configurable stimulus/response controller configured for generating the analog stimulus signal for evaluating an array of magnetic tunnel junction devices, for receiving the response waveform from the array of magnetic tunnel junction devices, and processing the digitized response signals for determining the characteristics of the magnetic tunnel junction devices of the array of the magnetic tunnel junction devices embodying the principals of this disclosure.

FIG. 6 is a functional block diagram of a configurable stimulus/response controller 400 configured for generating the analog stimulus signals 107a, . . . , 107n for evaluating an array 415 of magnetic tunnel junction devices MTJ, for receiving the response waveform 112a, . . . , 112n from the array 415 of magnetic tunnel junction devices MTJ, and processing the digitized response signals for determining the characteristics of the magnetic tunnel junction devices MTJ of the array 415 of the magnetic tunnel junction devices MTJ embodying the principals of this disclosure.

The fundamental structure and function of the configurable stimulus/response controller 400 is the same as the configurable stimulus/response controller 100 except for the addition of an array column selector 405 and modification of the response waveform receiver 450 to receive the digitized response signals from the ADC's 110a, 110b, . . . , 110n.

The array column selector 405 is connected to the stimulus waveform generator 240 for receiving the digital description of the stimulus signal. The array column selector 405 is also connected to the control interface 280. The environmental commands 215a are transferred to the control interface 280 for encoding and conditioning for transfer to the environmental hardware controller 130. In addition to the magnetic field controls 285a, the thermal controls 285b, and the probe controls 285c, the hardware commands include the column selection controls 410. The column selection controls 410 provide the control data for selecting the column of the array the MTJ DUT's that are to be tested. The array column selector 405 is connected to one of the DAC's 105a, 105b, . . . , 105n. Each one of the DAC's 105a, 105b, . . . , 105n connected to a column connect line CL1, CL2, . . . , CLn that is connected to the first terminal of each of the MTJ DUT's on the column.

As described above, the test operation and the test pattern signals 215c are transferred to and retained by the stimulus memory 225 and upon receipt of the trigger signal 220, the stimulus waveform generator retrieves the test operation and test pattern signals from the stimulus memory 225 decodes the test operation data and forms the test pattern signals into the digital description of the analog stimulus signal. The digital description of the analog stimulus signal is transferred to the array column select circuit 405. The column controls 410 select one of the outputs of the array column select circuit 405 for transferring the digital descriptions of the analog stimulus signal to the selected inputs of the DAC's 105a, 105b, . . . , 105n. The digital descriptions of the analog stimulus signals are converted to the analog signals 107a, . . . , 107n and applied to first terminal of the MTJ DUT's on the selected columns.

The analog signals 107a, 107b, . . . , 107n as applied to first terminal of the MTJ DUT's on the selected columns, are attenuated within the MTJ DUT's and transferred to the second terminal of the MTJ DUT's to become the response analog signals 112a, 112b, . . . , 112n. The response analog signals 112a, 112b, . . . , 112n from the selected column of the array 415 of MTJ DUT's are transferred respectively to the input of the ADC's 110a, 110b, . . . , 110n. The ADC's 110a, 110b, . . . , 110n convert the response analog signals 112a, . . . , 112n to digitized response analog signals 312a, . . . , 312n that are transferred to the response waveform receiver 450. The response waveform receiver 450 is structured to receive the digitized response analog signals 312a, . . . , 312n performing the identical functions as the response waveform receiver 250 of FIG. 4. The captured digitized response analog signals are transferred from the response waveform receiver 450 to the response memory 270 for evaluation and characterization as described above.

Figure 7A:
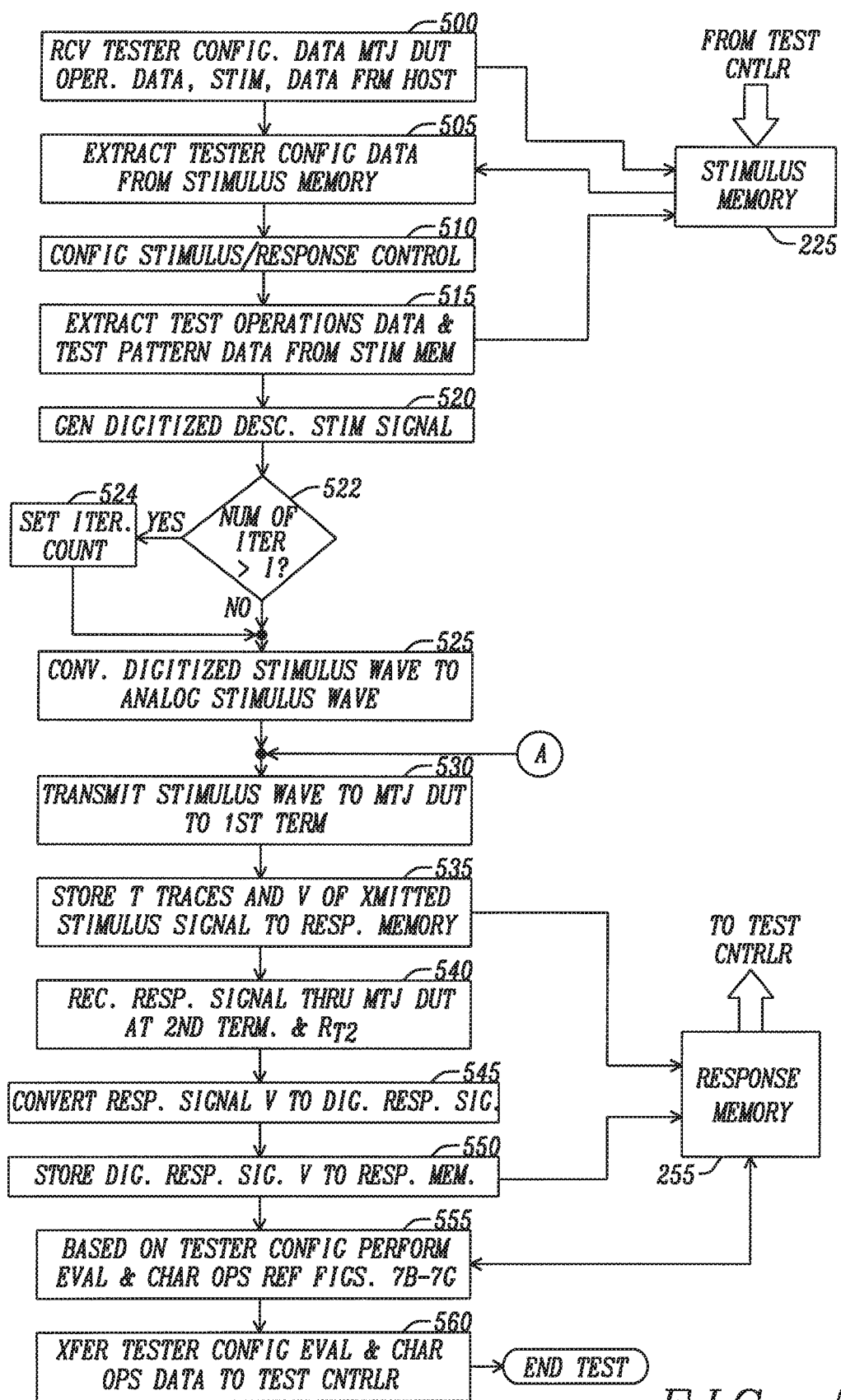
FIGS. 7A-7G are flowcharts detailing a method for testing and evaluating a magnetic tunnel junction device embodying the principals of this disclosure.

FIGS. 7A-7F are flowcharts detailing a method of operation of a test head electronics unit for testing and evaluating a magnetic tunnel junction device embodying the principals of this disclosure. Referring to FIG. 7A, the test head electronics unit receives (Box 500) tester configuration data, test operation data and test pattern data that is stored in the stimulus memory 225 from the tester controller 140 of FIG. 3. The tester configuration data is extracted (Box 505) from the stimulus memory 225 and the stimulus response controller is configured (Box 510) to perform a selected evaluation and characterization function. The tester operation data and the test pattern data are extracted (Box 515) from the stimulus memory 225 and a digital description of the stimulus signal is generated (Box 520). An iteration count that is stored in the test operation data in the stimulus memory 225 is examined (Box 522). If the iteration count indicates that more that one of the stimulus signal is to be applied to the MTJ DUT('s) 5 of FIGS. 4-6, an iteration counter is set (Box 524) to the iteration count.

The digital description of the stimulus signal is then converted (Box 525) by a DAC 105 of FIGS. 4-6. The analog stimulus signal is transferred (Box 530) to the MTJ DUT('s) 5. The time traces and the voltage levels of the analog stimulus signal is stored (Box 535) to the response memory 255. The response signal from the analog stimulus signal is received (Box 540) at a second terminal of the MTJ DUT('s) 5 and transferred to an ADC 110 for conversion (Box 545) to a digitized response signal. The digitized response signal is stored (Box 550) in the response memory 255. Based on the test configuration, the evaluation and characterization operations are performed (Box 555) as shown in FIGS. 7B-7G. If the evaluation and characterization operations of FIGS. 7B-7G have multiple iterations, the test returns to A and the analog stimulus signal is transferred (Box 530) to the MTJ DUT('s) 5 and the process continues. If there are no iterations of the testing or all the iterations have been executed, then the test is ended.

Figure 7B:
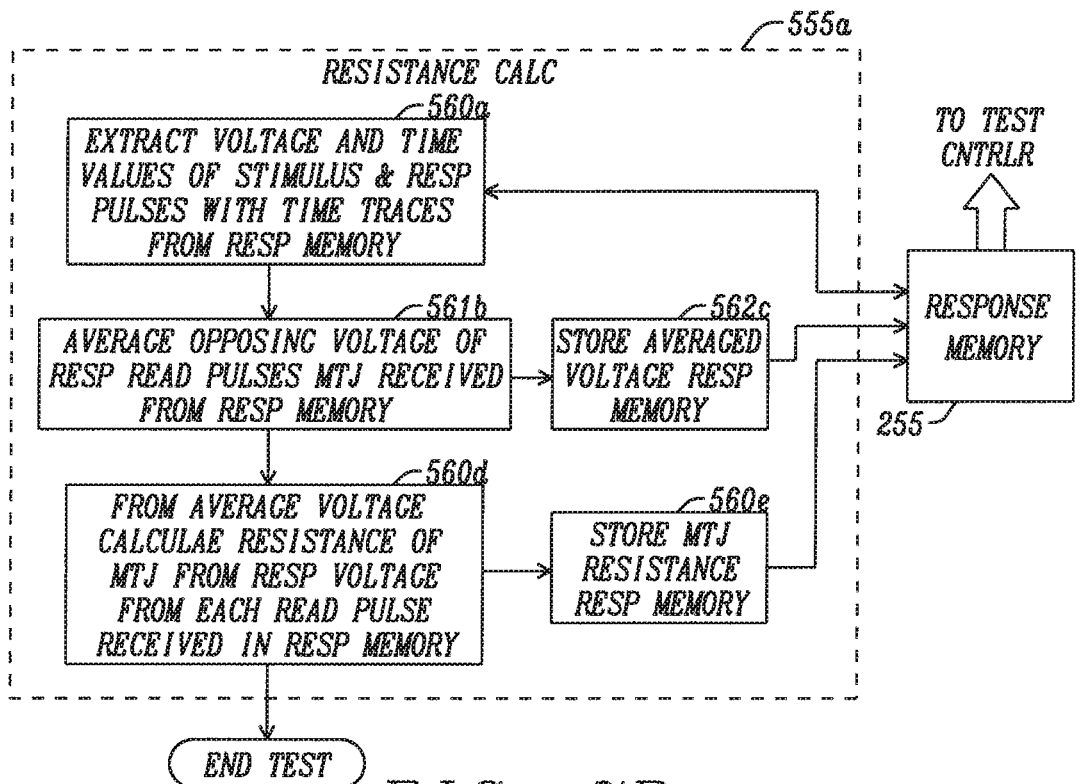

FIG. 7B is a flowchart illustrating an example of performing characterizing and evaluating (Box 555) of FIG. 7A. This example of performing characterization and evaluating (Box 555a) is a resistance calculation of a magnetic tunnel junction device MTJ DUT ('s) that begins with extracting (Box 560*a*) the voltages and time traces for the digitized stimulus and response signals from the response memory 255.

The voltages of the read pulses (80 and 85 of FIG. 2B) as retrieved from the response memory 226 is averaged (Box 560*b*) and the average value is stored (Box 560*c*) in the response memory 255. From the averaged voltages of the read pulses (80 and 85 of FIG. 2B) at the first terminal of the termination resistor $R_{T2}$ that connected to the second terminal of the MTJ DUT 5, the current is inferred from the value of the termination resistor $R_{T2}$. The resistance of the MTJ DUT('s) 5 is calculated (Box 560*d*) for each of the read pulses (80 and 85 of FIG. 2B) and the resistance of the MTJ DUT ('s) 5 is then stored in the response memory 255.

Figure 7C:
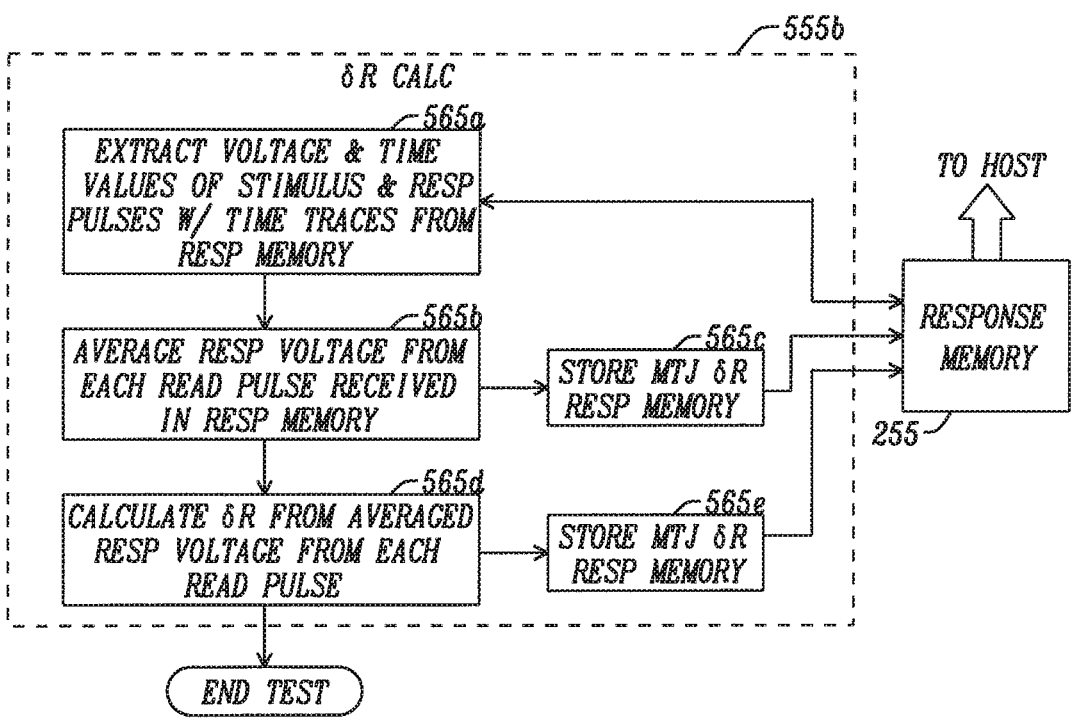

FIG. 7C is a flowchart illustrating an example of performing characterizing and evaluating (Box 555) of FIG. 7A. This example of performing characterizing and evaluating (Box 555*b*) is a differential resistance calculation of a magnetic tunnel junction device MTJ DUT ('s) that begins with extracting (Box 565*a*) the voltages and time traces for the digitized stimulus and response signals from the response memory 255. The voltages of the individual response pulses (710 and 715 of FIG. 8B) as retrieved from the response memory 226 is averaged (Box 565*b*) and the average value is stored (Box 565*c*) in the response memory 255.

The voltages of the stimulus pulses (700 and 705 of FIG. 8A) and the averaged voltages of the response pulses (710 and 715 of FIG. 8B) as retrieved from the response memory 226 are used to calculate (Box 565*d*) the differential resistance δR and is calculated according to the equation:

$$\delta R \approx \frac{V_2 - V_1}{V'_2 - V'_1} * 2 * R_{TERM}$$

Where:
$R_{MTJ} \gg R_{TERM}$
δR is the differential resistance of the MTJ DUT 5.
$V_1$ is the amplitude value of the first stimulus read pulse 700.
$V'_1$ is the amplitude value of the first response read pulse 710.
$V_2$ is the amplitude value of the second stimulus read pulse 705.
$V'_2$ is the amplitude value of the second response read pulse 715.

Figure 7D:
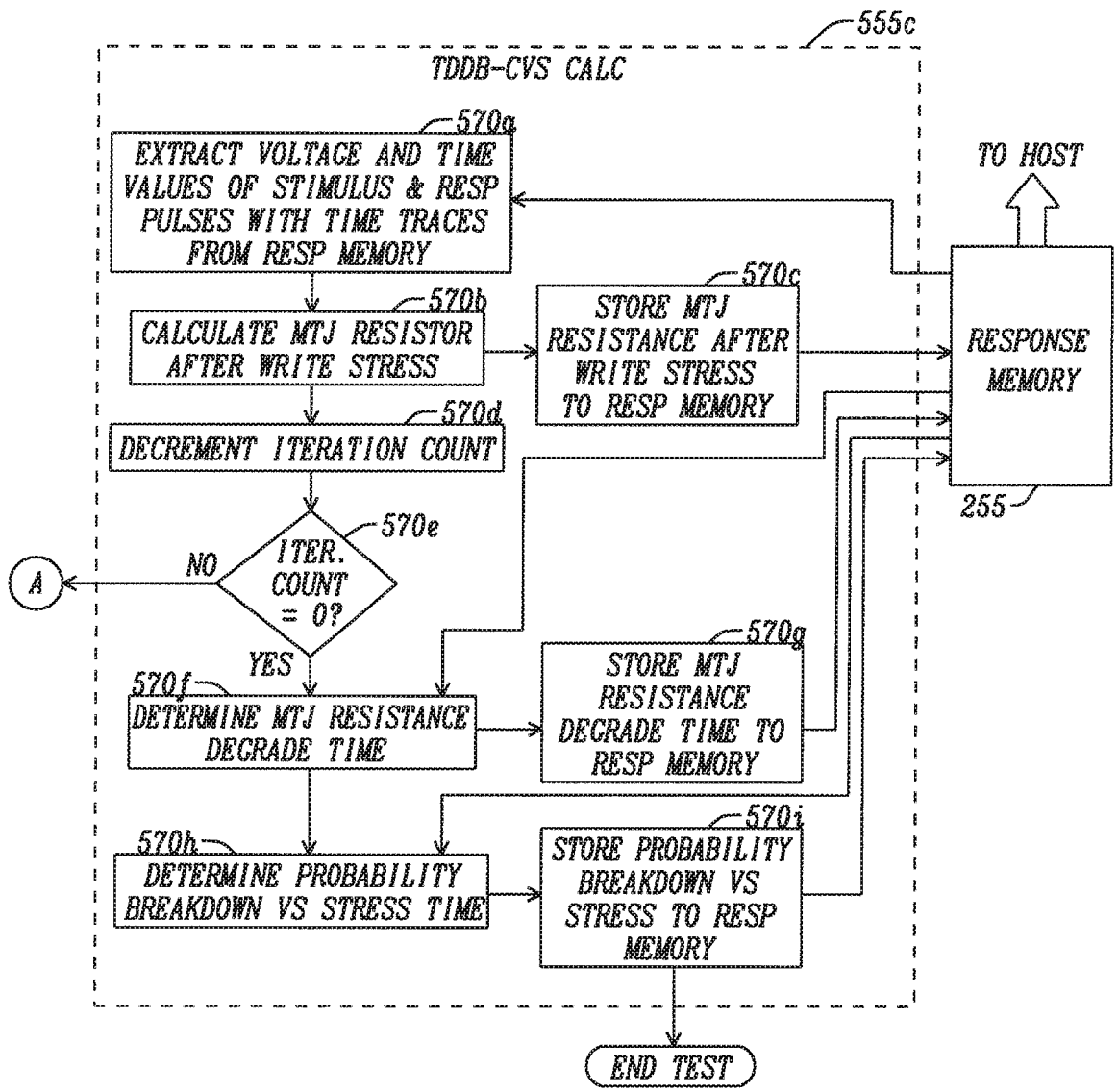

FIG. 7D is a flowchart illustrating an example of performing characterizing and evaluating (Box 555) of FIG. 7A. This example of performing characterizing and evaluating (Box 555*c*) is a time dependent dielectric breakdown (TDDB) calculation of a magnetic tunnel junction device MTJ DUT ('s) that begins with extracting (Box 570*a*) the voltages and time traces for the digitized stimulus and response signals from the response memory 255. In the time dependent dielectric breakdown (TDDB) testing, the MTJ DUT('s) 5 is subjected to series of stimulus write signals 720*a*, . . . , 720*n* having a constant amplitude followed by a stimulus read signal 725 as shown in FIG. 9A. The response signal at the Output of the MTJ DUT('s) 5 is formed of the attenuated stimulus write signals 720*a*, . . . , 720*n* and the stimulus read signal 725.

The resistance of the MTJ DUT('s) 5 is calculated (Box 570*b*) from the digitized response read signals (the attenuated stimulus read signal 725) and determines the resistance of the MTJ DUT 5 at each of the timing traces. The resistances of the MTJ DUT('s) 5 are then stored (Box 570*c*) in the response memory 270 with the corresponding timing traces. If the test operation instructions require multiple iterations of the stimulus write signals 720*a*, . . . , 720*n*, the iteration counter will be set to be greater than one. If not, the iteration counter is set to a single transfer of the stimulus write signals 720*a*, . . . , 720*n* to the MTJ DUT('s) 5. The iteration counter is decremented (Box 570*d*). The iteration counter is then examined (Box 570*e*) and if there are multiple iterations designated by the test operation instructions, the stimulus write signals 720*a*, . . . , 720*n* and the stimulus read signal 725 are transferred (Box 530) to the MTJ DUT('s) 5. If there is a single iteration or all iterations are completed, the times at which there is a degradation of the dielectric of the MTJ DUT('s) 5 is determined (Box 5700 and the degradation times of the MTJ DUT('s) 5 are stored (Box 570*g*) to the response memory 255.

The degradation times of the MTJ DUT('s) 5 are retrieved from the response memory 255 and are used to determine (Box 570*h*) the probability of breakdown of the dielectric of the MTJ DUT('s) 5 versus the time of the stress. The probability of breakdown versus the time of the stress is then (Box 570*i*) is then stored in the response memory.

Figure 7E:
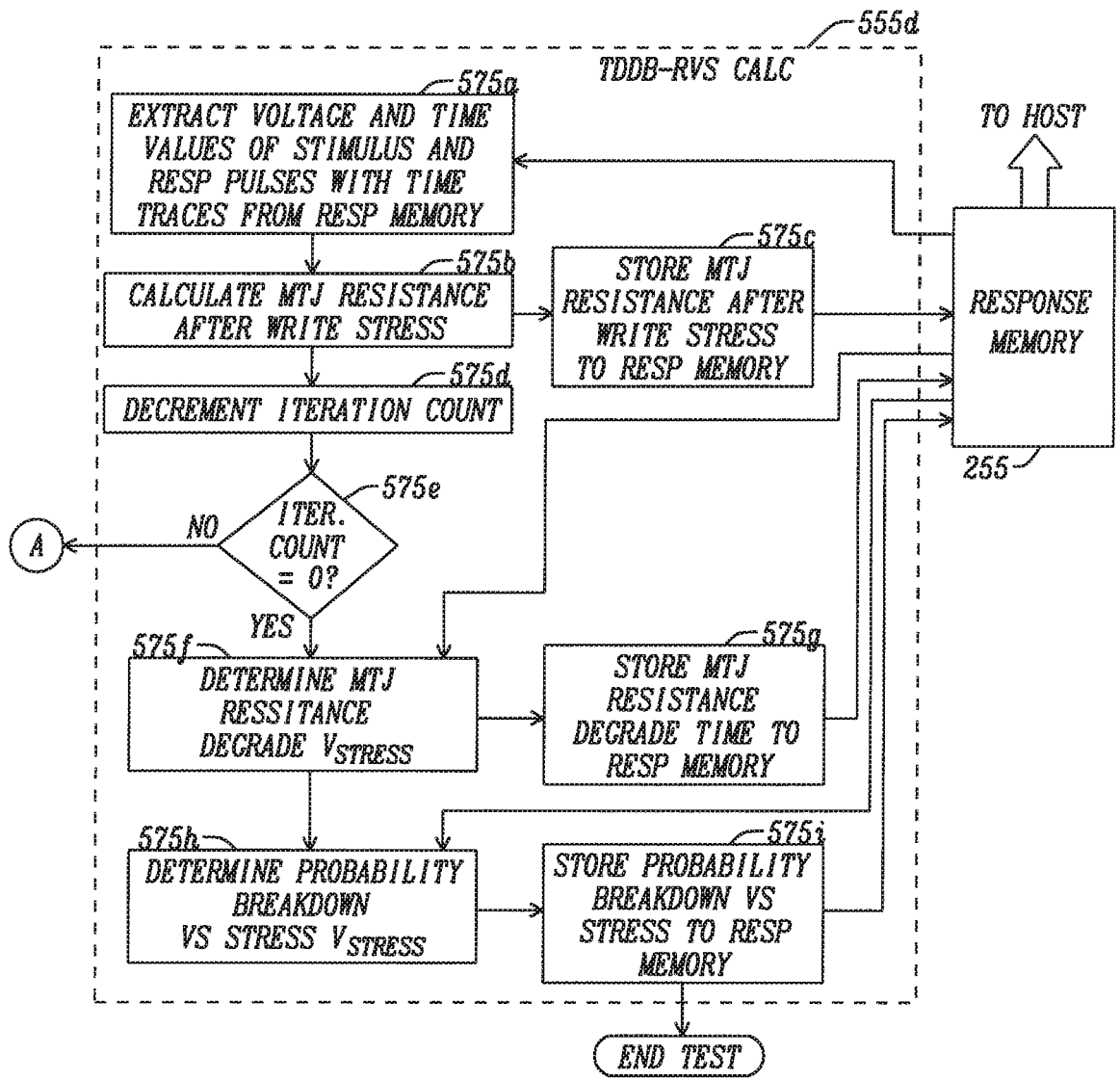

FIG. 7E is a flowchart illustrating an example of performing characterizing and evaluating (Box 555) of FIG. 7A. This example of performing characterizing and evaluating (Box 555*d*) is a time dependent dielectric breakdown (TDDB) calculation of a magnetic tunnel junction device MTJ DUT ('s) that begins with extracting (Box 575*a*) the voltages and time traces for the digitized stimulus and response signals from the response memory 255. In the time dependent dielectric breakdown (TDDB) testing, the MTJ DUT('s) 5 is subjected to series of stimulus write signals 740*a*, 740*b*, . . . , 740*n* having an increased ramping amplitude followed by a stimulus read signal 745*a*, 745*b*, . . . , 745*n* as shown in FIG. 10A. The response signal at the output of the MTJ DUT('s) 5 is formed of the attenuated stimulus write signals 740*a*, 740*b*, . . . , 740*n* and the stimulus read signal 745*a*, 745*b*, . . . , 745*n*.

The resistance of the MTJ DUT('s) 5 is calculated (Box 575*b*) from the digitized response read signals (the attenuated stimulus read signal 745*a*, 745*b*, . . . , 745*n*) and determines the resistance of the MTJ DUT 5 at each of the timing traces. The resistances of the MTJ DUT('s) 5 are then stored (Box 575*c*) in the response memory 270 with the corresponding timing traces. If the test operation instructions require multiple iterations of the stimulus write signals 745*a*, . . . , 720*n*, the iteration counter will be set to be greater than one. If not, the iteration counter is set to a single transfer of the stimulus write signals 740*a*, . . . , 740*n* to the MTJ DUT('s) 5. The iteration counter is decremented (Box 575*d*). The iteration counter is then examined (Box 575*e*) and if there are multiple iterations designated by the test operation instructions, the stimulus write signals 740*a*, . . . , 740*n* and the stimulus read signal 725 are transferred (Box 530) to the MTJ DUT('s) 5. If there is a single iteration or all iterations are completed, the times at which there is a degradation of the dielectric of the MTJ DUT('s) 5 is determined (Box 575*f*) and the degradation times of the MTJ DUT('s) 5 are stored (Box 575*g*) to the response memory 255.

The degradation times of the MTJ DUT('s) 5 are retrieved from the response memory 255 and are used to determine (Box 575*h*) the probability of breakdown of the dielectric of the MTJ DUT('s) 5 versus the voltage level of the stimulus write signal 740*a*, . . . , 740*n* stress. The probability of breakdown versus the voltage of the stimulus write signal 740a, . . . , 740n stress is then (Box 575i) is then stored in the response memory.

Figure 7F:
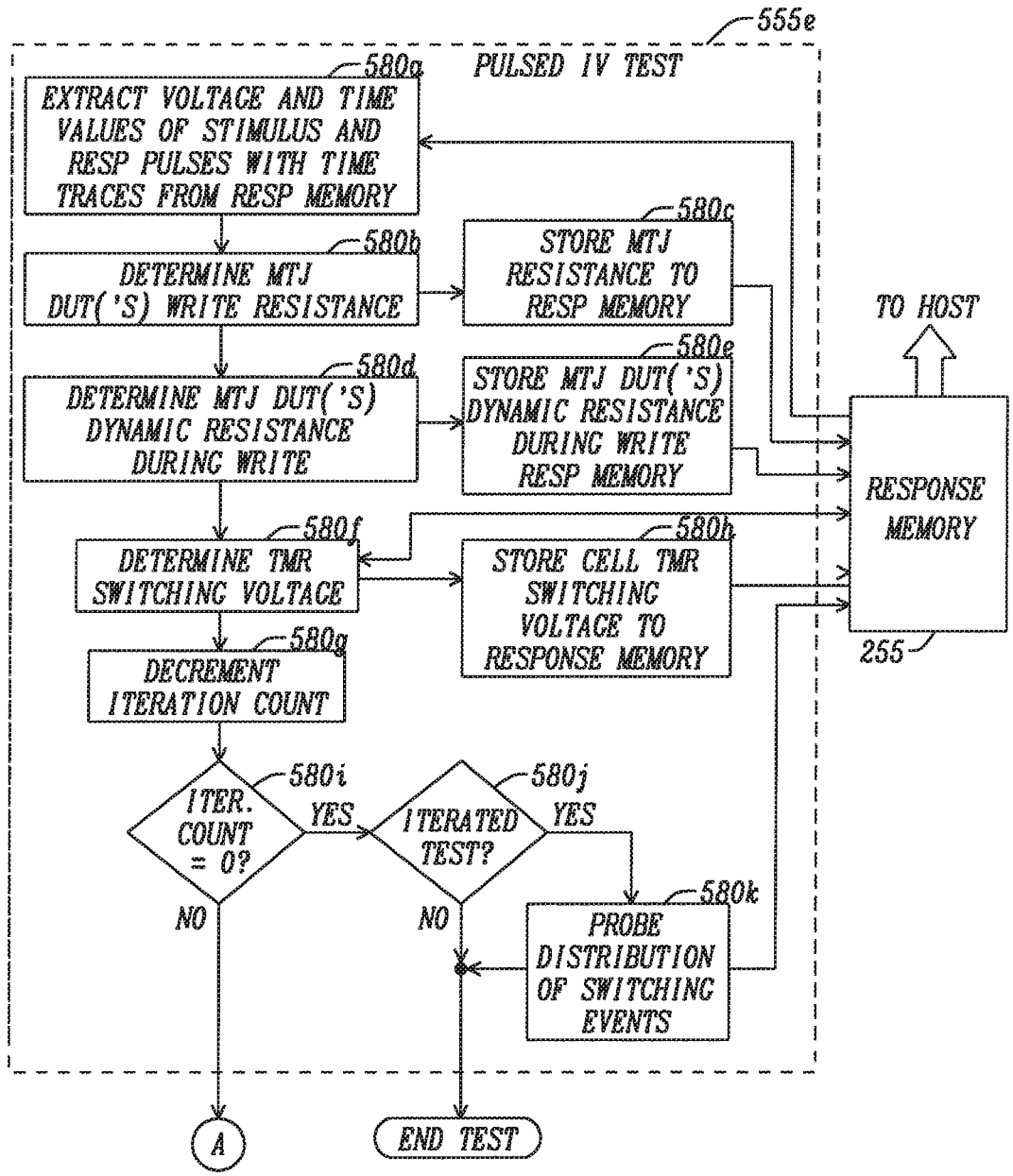

FIG. 7F is a flowchart illustrating an example of performing characterizing and evaluating (Box 555) of FIG. 7A. This example of performing characterizing and evaluating (Box 555e) is a pulse current/voltage calculation that allows for the extraction of the tunnel magnetoresistance (TMR) of a magnetic tunnel junction device MTJ DUT ('s) that begins with extracting (Box 580a) the voltages and time traces for the digitized stimulus and response signals from the response memory 255. In the pulse current/voltage testing, the MTJ DUT('s) 5 is subjected to series of stimulus write signals 740a, 740b, . . . , 740n having an increased ramping amplitude followed by a stimulus read signal 745a, 745b, . . . , 745n as shown in FIG. 10A. The response signal at the output of the MTJ DUT('s) 5 is formed of the attenuated stimulus write signals 740a, 740b, . . . , 740n and the stimulus read signal 745a, 745b, . . . , 745n.

The resistance of the MTJ DUT('s) 5 is calculated (Box 580b) from the digitized read signals (the attenuated stimulus read signal 745a, 745b, . . . , 745n) for determining the resistance of the MTJ DUT 5 at each of the timing traces. The resistances during the read period of the response signals of the MTJ DUT('s) 5 are then stored (Box 580c) in the response memory 270 with the corresponding timing traces. The resistance of the MTJ DUT('s) 5 is then calculated (Box 580d) from the digitized response write (the attenuated stimulus write signals 740a, 740b, . . . , 740n) for determining the resistance of the MTJ DUT 5 at each of the timing traces. The resistances during the write period of the response signals of the MTJ DUT('s) 5 are then stored (Box 580e) in the response memory 270 with the corresponding timing traces. From the stored resistances during the write period of the response signals and resistances during the read period of the response signals of the MTJ DUT('s) 5, the TMR switching voltages are determined (Box 580e). The TMR switching voltages of the MTJ DUT('s) 5 are then stored (Box 580f) in the response memory 270 with the corresponding timing traces.

If the test operation instructions require multiple iterations of the stimulus write signals 745a, . . . , 720n, the iteration counter will be set to be greater than one. If not, the iteration counter is set to a single transfer of the stimulus write signals 740a, . . . , 740n to the MTJ DUT('s) 5. The iteration counter is decremented (Box 580g). The iteration counter is then examined (Box 580h) to determine if all the all iterations are complete (=0) and if there are multiple iterations designated by the test operation instructions, the stimulus write signals 740a, . . . , 740n and the stimulus read signal stimulus read signal 745a, 745b, . . . , 745n are transferred (Box 530) to the MTJ DUT('s) 5.

If iteration is zero, it is determined (Box 580j) if there was a single or multiple iterations designated by the test operation instructions. If there is a single iteration designated by the test operation instructions, the pulse current/voltage test is completed. If there were multiple iterations, the values of the TMR calculations are probed to determine (Box 580h) a distribution of the switching events of the MTJ DUT('s) and then the pulse current/voltage test is completed.

Figure 7G:
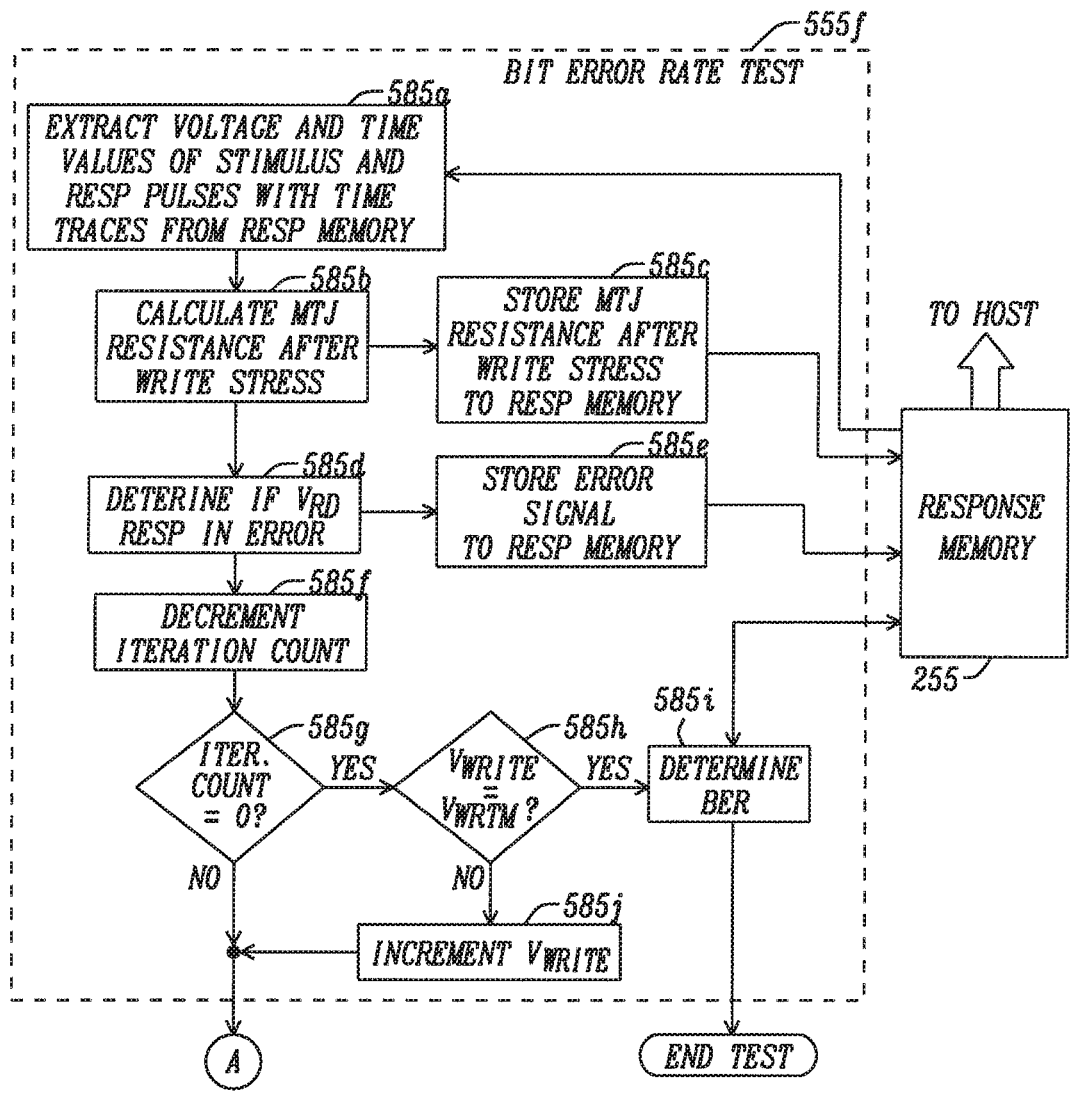

FIG. 7G is a flowchart illustrating an example of performing characterizing and evaluating (Box 555) of FIG. 7A. This example of performing characterizing and evaluating (Box 555f) is a bit error rate calculation of a magnetic tunnel junction device MTJ DUT ('s) that begins with extracting (Box 585a) the voltages and time traces for the digitized response read signals (770a, . . . , 770n of FIG. 11A) from the response memory 255.

The voltages of the response read pulses (770a, . . . , 770n of FIG. 11A) as retrieved from the response memory 226 are derived from the measurements at the first terminal of the termination resistor $R_{T2}$ that connected to the second terminal of the MTJ DUT 5, the current is inferred from the value of the termination resistor $R_{T2}$. The resistance of the MTJ DUT('s) 5 is calculated (Box 585b) for each of the response read pulses (770a, . . . , 770n of FIG. 11A) and the resistance of the MTJ DUT ('s) 5 is then stored (Box 585b) in the response memory 255.

Return now to FIG. 7A. When the evaluation and characterization operations are performed (Box 555) as shown in FIGS. 7B-7G, the data of evaluation and characterization operations is transferred (Box 590) to tester controller 140 of FIG. 3. The evaluation and characterization operations data are formatted, and plots of the results of the evaluation and characterization operations are constructed. The tester process is then ended.

Figure 9B:
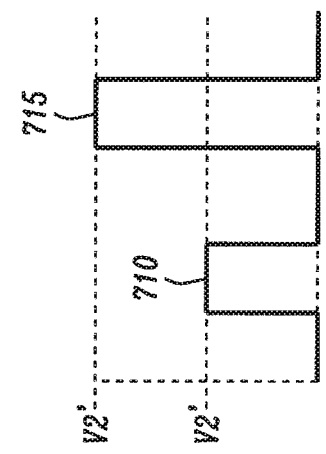
FIG. 9B is a plot of the results of a constant voltage of a stimulus signal generated by a configurable stimulus/response controller of FIG. 9A for determining the time dependent dielectric breakdown (TDDB) of magnetic tunnel junction devices embodying the principals of this disclosure.

FIG. 9B is a plot 735 of the results of a constant voltage of a stimulus signal of FIG. 9A generated by a configurable stimulus/response controller 260 of FIGS. 4, 5, and 6 for determining the time dependent dielectric breakdown (TDDB) of magnetic tunnel junction devices embodying the principals of this disclosure. The resistance of the MTJ DUT('s) 5 that is determined from the attenuated stimulus write signals 720a, . . . , 720n and the stimulus read signal 725 of FIG. 9A is transferred from the response memory 255 of FIG. 7D to the tester controller 140 of FIG. 3. The tester controller 140 the calculates the total time of the stress from the pulse width of the stimulus write signals 720a, . . . , 720n. With the resistances as calculated by the configurable stimulus/response controller 260 of FIGS. 4, 5, and 6 the tester controller 140 determines the probability of the breakdown of the insulating layer of the MTJ DUT('s) versus time as shown in the plot 735 of FIG. 9B.

FIG. 10B is a plot 750 of the results of an increasing ramp voltage of stimulus signals of FIG. 10A generated by a configurable stimulus/response controller 260 of FIGS. 4, 5, and 6 for determining the time dependent dielectric breakdown (TDDB) of magnetic tunnel junction devices MTJ DUT('s) 5 embodying the principals of this disclosure. The resistance of the MTJ DUT('s) 5 that is determined from the attenuated stimulus write signals 740a, . . . , 740n and the stimulus read signals 745a, . . . , 745n of FIG. 10A is transferred from the response memory 255 of FIG. 7E to the tester controller 140 of FIG. 3. The tester controller then calculates the total time of the stress from the pulse width of the stimulus write signals 740a, . . . , 740n. With the resistances as calculated by the configurable function circuit 260 of FIGS. 4, 5, and 6 the tester controller 140 determines the probability of the breakdown of the insulating layer of the MTJ DUT('s) versus time as shown in the plot 750 of FIG. 10B.

FIGS. 10C and 10D are plots of results of an increasing ramp voltage of stimulus signals of FIG. 10A generated by a configurable function circuit 260 of FIGS. 4, 5, and 6 for determining the dynamic resistance and resistance after evaluation and analysis operations pulse for extracting tunnel magnetoresistance (TMR) of magnetic tunnel junction devices MTJ DUT('s) 5 embodying the principals of this disclosure.

The resistance of the MTJ DUT('s) 5 that is determined from the attenuated stimulus write signals 740a, . . . , 740n and the stimulus read signals 745a, . . . , 745n of FIG. 10A is transferred from the response memory 255 of FIG. 7F to the tester controller 140. The tester controller 140 then arranges a table of the of the stimulus write signals 740*a*, . . . , 740*n* versus the resistance of determined during the stimulus write signals 740*a*, . . . , 740*n* for the plot 755 of the FIG. 10C. The tester controller 140 then arranges a table of the of the stimulus write signals 740*a*, . . . , 740*n* versus the resistance of determined during the stimulus read signals 745*a*, . . . , 745*n* for the plot 760 of the FIG. 10D. With the resistances as calculated by the configurable function circuit 260 of FIGS. 4, 5, and 6, the values of the TMR calculations are displayed to illustrate the TMR values of the MTJ DUT('s) 5.

Figure 11B:
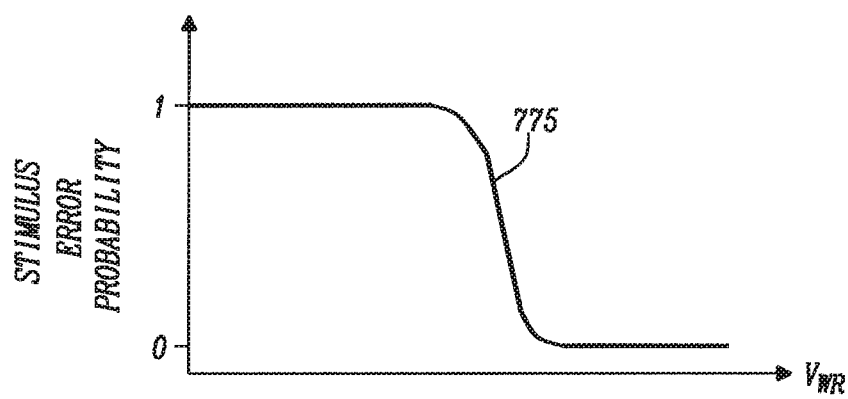
FIG. 11B is a plot of the results of the evaluation and analysis operations/response waveform of a stimulus signal generated by a configurable stimulus/response controller of FIG. 11A for determining the bit error rates of magnetic tunnel junction devices embodying the principals of this disclosure.

FIG. 11B is a plot 775 of the results of the evaluation and analysis operations/response waveform of a stimulus signal stimulus write signals 765*a*, 765*b*, 765*c*, . . . , 765*n* and the stimulus read signal 770*a*, 770*b*, 770*c*, . . . , 770*n* of FIG. 11A generated by a configurable function circuit 260 of FIGS. 4, 5, and 6 for determining the bit error rates of MTJ DUT('s) 5 embodying the principals of this disclosure. The resistances of the MTJ DUT('s) 5 and the corresponding voltage of the stimulus write signals 765*a*, 765*b*, 765*c*, . . . , 765*n* and the stimulus read signal 770*a*, 770*b*, 770*c*, . . . , 770*n* with the timing trace records are extracted from the response memory 255 of FIG. 7G. The timing trace and voltage of failures of the MTJ DUT('s) 5 are similarly transferred to the tester controller 140 of FIG. 3. The tester controller 140 of FIG. 3 may collect the results of multiple individual tests or in various embodiments, the test controller 140 may be configured as in FIGS. 5 and 6 for testing multiple MTJ DUT's 5. If multiple MTJ DUT's 5 are evaluated, the plot 775 illustrates the probability of an error versus the write stimulus voltage of failure.

While this disclosure has been particularly shown and described with reference to the preferred embodiments thereof, it will be understood by those skilled in the art that various changes in form and details may be made without departing from the spirit and scope of the disclosure. In particular, the configurations of the configurable function circuit 260 of the stimulus/response controller 100 of FIGS. 3, 4, 5, and 6 may include other functions for evaluating and characterizing MTJ DUT's that are not illustrated.

What is claimed is:

1. A method for evaluating electrical characteristics of at least one magnetic tunnel junction (MTJ) device under test (DUT) comprising the steps of:
   receiving tester configuration data, test pattern data, and tester operation data;
   configuring a configurable circuit for performing a designated test evaluation and analysis function based on the tester configuration data;
   generating a stimulus waveform based upon the tester configuration data, the tester operation data, and the test pattern data;
   converting the stimulus waveform to an analog stimulus signal;
   transferring the analog stimulus signal to a first terminal of the at least one MTJ DUT at reception of a trigger timing signal;
   generating time traces based on the trigger timing signal;
   attenuating the analog stimulus signal as the analog stimulus signal is transferred through the MTJ DUT such that a response signal is developed at a second terminal of the MTJ DUT and across a termination resistor;
   converting the response signal to a digitized response signal indicating its voltage amplitude; and
   performing the designated test evaluation and analysis function in the configurable circuit based on voltage amplitudes and time values of the stimulus waveform, the digitized response signal, and the timing traces.

2. The method of claim 1, further comprising:
   storing the tester configuration data, the test pattern data and the tester operation data in a stimulus memory; and
   storing the timing traces and a voltage amplitude of the stimulus waveform to a response memory.

3. The method of claim 2, wherein the stimulus memory and the response memory are non-transitory storage media.

4. The method of claim 2, further comprising storing voltage amplitudes of the digitized response signal to the response memory.

5. The method of claim 2, further comprising storing results of the designated test evaluation and analysis function in the response memory.

6. The method of claim 1, wherein the designated test evaluation and analysis function is configured for averaging voltage amplitudes of the stimulus waveform or the response signal of the at least one MTJ DUT.

7. The method of claim 1, wherein the designated test evaluation and analysis function is configured for determining a differential resistance of the at least one MTJ DUT.

8. The method of claim 1, wherein the designated test evaluation and analysis function is configured for determining a degradation time with constant voltage stress of the at least one MTJ DUT.

9. The method of claim 1, wherein the designated test evaluation and analysis function is configured for determining a degradation time with ramped voltage stress of the at least one MTJ DUT.

10. The method of claim 1, wherein the designated test evaluation and analysis function is configured for determining a failure count with times of failure of the at least one MTJ DUT.

11. The method of claim 1, wherein the designated test evaluation and analysis function is configured for determining a bit error rate of the at least one MTJ DUT.

12. A method for evaluating electrical characteristics of at least one magnetic tunnel junction (MTJ) device under test (DUT) comprising the steps of:
   receiving tester configuration instructions, test pattern data, and tester operation data;
   based on the tester configuration instructions, configuring a configurable function circuit for performing a designated test evaluation and analysis function;
   generating a stimulus waveform based upon the tester configuration instructions, the tester operation data, and the test pattern data;
   converting the stimulus waveform to an analog stimulus signal;
   applying the analog stimulus signal to a first terminal of the at least one MTJ DUT at reception of a trigger timing signal;
   generating time traces based on the trigger timing signal;
   storing the timing traces and a voltage amplitude of the stimulus waveform to a response memory;
   generating a response signal at a second terminal of the MTJ DUT and across a termination resistor as the analog stimulus signal is transferred through the MTJ DUT;
   recording and converting the response signal to a digitized response signal indicating its voltage amplitude;
   storing the voltage amplitude of the digitized response signal to the response memory;

performing the designated test evaluation and analysis function in the configurable function circuit based on the voltage amplitude and time values of the stimulus waveform, the digitized response signal, and the timing traces; and storing results of the designated test evaluation and analysis function in the response memory.

13. The method of claim 12, further comprising retaining the tester configuration instructions, the test pattern data, and the tester operation data in a non-transitory stimulus memory after the receiving and before the configuring.

14. The method of claim 12, further comprising decoding the tester configuration instructions before the configuring.

15. The method of claim 12, further comprising storing results of the designated test evaluation and analysis function in the response memory.

16. The method of claim 15, further comprising extracting stored results of the designated test evaluation and analysis function for transfer to a tester controller for further analysis and display.

17. A method for evaluating electrical characteristics of at least one magnetic tunnel junction (MTJ) device under test (DUT) comprising the steps of:

receiving tester configuration instructions, test pattern data, and tester operation data from a tester controller;

retaining the tester configuration instructions, the test pattern data, and the tester operation data in a non-transitory stimulus memory;

configuring a configurable function circuit for performing a designated test evaluation and analysis function based on the tester configuration instructions;

generating a stimulus waveform based on the tester configuration instructions, the tester operation data, and the test pattern data;

converting the stimulus waveform to an analog stimulus signal;

transferring the analog stimulus signal to a first terminal of the at least one MTJ DUT at reception of a trigger timing signal;

generating time traces based on the trigger timing signal;

storing the timing traces and a voltage amplitude of the stimulus waveform to a non-transitory response memory;

attenuating the analog stimulus signal as the analog stimulus signal is transferred through the MTJ DUT such that a response signal is developed at a second terminal of the MTJ DUT and across a termination resistor;

recording and converting the response signal to a digitized response signal indicating its voltage amplitude;

storing the voltage amplitude of the digitized response signal to the non-transitory response memory;

extracting the voltage amplitude and time values of the stimulus waveform, the digitized response signal, and the timing traces for executing the designated test evaluation and analysis function in the configurable function circuit;

performing the designated test evaluation and analysis function in the configurable function circuit; and storing results of the designated test evaluation and analysis function in the non-transitory response memory.

18. The method of claim 17, wherein the designated test evaluation and analysis function includes a response pulse averaging function, a differential resistance calculation, a time dependent dielectric breakdown test with a constant voltage stress, a time dependent dielectric breakdown test with a ramped voltage stress, or a bit error rate calculation.

19. The method of claim 17, further comprising decoding the tester configuration instructions and the tester operation data before the configuring of the configurable function circuit and the generating of the stimulus waveform.

20. The method of claim 17, further comprising extracting stored results of the designated test evaluation and analysis function for transfer to the tester controller for further analysis and display.

* * * * *